(12) United States Patent
Park et al.

(10) Patent No.: US 11,569,298 B2
(45) Date of Patent: Jan. 31, 2023

(54) IMAGE SENSORS HAVING LOWER ELECTRODE STRUCTURES BELOW AN ORGANIC PHOTOELECTRIC CONVERSION LAYER

(71) Applicant: SAMSUNG ELECTRONICS CO., LTD., Suwon-si (KR)

(72) Inventors: Sangchun Park, Seoul (KR); Kwansik Kim, Seoul (KR); Hongki Kim, Hwaseong-si (KR); Sangsu Park, Seoul (KR); Beomsuk Lee, Seoul (KR); Taeyon Lee, Seoul (KR); Gwideok Ryan Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 155 days.

(21) Appl. No.: 17/034,316

(22) Filed: Sep. 28, 2020

(65) Prior Publication Data
US 2021/0175286 A1 Jun. 10, 2021

(30) Foreign Application Priority Data
Dec. 5, 2019 (KR) .................. 10-2019-0160961

(51) Int. Cl.
*H01L 27/30* (2006.01)
*H01L 27/146* (2006.01)
*H01L 51/44* (2006.01)

(52) U.S. Cl.
CPC ...... *H01L 27/307* (2013.01); *H01L 27/14601* (2013.01); *H01L 27/14621* (2013.01);
(Continued)

(58) Field of Classification Search
CPC ............ H01L 27/307; H01L 27/14621; H01L 27/14627; H01L 27/14629;
(Continued)

(56) References Cited

U.S. PATENT DOCUMENTS 8,854,517 B2 * 10/2014 Honda ................. H04N 5/3765
                                                        348/274
9,070,888 B2   6/2015 Leem et al.
(Continued)

FOREIGN PATENT DOCUMENTS

CN           101807613 A  *  8/2010

*Primary Examiner* — Jennifer D Bennett
*Assistant Examiner* — Erin R Garber
(74) *Attorney, Agent, or Firm* — F. Chau & Associates, LLC

(57) ABSTRACT

An image sensor includes a first substrate having a first surface and a second surface opposite to the first surface. The first substrate includes an active pixel region having a plurality of active pixels. A plurality of lower electrode structures is disposed on the second surface of the first substrate and corresponds to the plurality of active pixels. An upper electrode is disposed on the plurality of lower electrode structures. An organic photoelectric conversion layer is disposed between the plurality of lower electrode structures and the upper electrode. A second substrate is disposed on the first surface of the first substrate. A driving circuit configured to drive the plurality of active pixels is disposed on the second substrate. The plurality of lower electrode structures includes a first barrier layer, a reflective layer disposed on the first barrier layer and a second barrier layer disposed on the reflective layer.

20 Claims, 19 Drawing Sheets

(52) U.S. Cl.
CPC .. *H01L 27/14627* (2013.01); *H01L 27/14629* (2013.01); *H01L 27/14636* (2013.01); *H01L 27/14643* (2013.01); *H01L 27/14645* (2013.01); *H01L 27/14665* (2013.01); *H01L 27/14687* (2013.01); *H01L 51/442* (2013.01); *H01L 27/14612* (2013.01); *Y02E 10/549* (2013.01)

(58) Field of Classification Search
CPC ............ H01L 27/14636; H01L 51/442; H01L 27/14612; H01L 27/14645; H01L 27/14665; H01L 27/14687; H01L 27/14601; H01L 27/14643; H01L 21/76898; H01L 2225/06541; Y02E 10/549
See application file for complete search history.

(56) References Cited

U.S. PATENT DOCUMENTS

| | | | |
|---|---|---|---|
| 9,728,586 | B2 | 8/2017 | Lee et al. |
| 9,768,226 | B2 | 9/2017 | Sakata et al. |
| 9,871,079 | B2 | 1/2018 | Lee et al. |
| 10,181,497 | B2 | 1/2019 | Heo et al. |
| 10,283,540 | B2 * | 5/2019 | Lee .................. H01L 27/14621 |
| 2018/0027171 | A1 * | 1/2018 | Yoshimura ............ H01L 51/441 257/40 |
| 2018/0180546 | A1 * | 6/2018 | Rothberg ............. C12Q 1/6869 |
| 2019/0123083 | A1 * | 4/2019 | Borthakur ......... H01L 27/14621 |
| 2019/0172872 | A1 | 6/2019 | Tsutsumi et al. |
| 2020/0006690 | A1 * | 1/2020 | Falk .................... H01L 51/5262 |
| 2020/0219914 | A1 * | 7/2020 | Kim .................. H01L 27/14636 |

* cited by examiner

IMAGE SENSORS HAVING LOWER ELECTRODE STRUCTURES BELOW AN ORGANIC PHOTOELECTRIC CONVERSION LAYER

CROSS-REFERENCE TO RELATED APPLICATION

This application claims priority under 35 U.S.C. § 119 to Korean Patent Application No. 10-2019-0160961, filed on Dec. 5, 2019 in the Korean Intellectual Property Office, the disclosure of which is incorporated by reference in its entirety herein.

1. TECHNICAL FIELD

The present inventive concepts relate to an image sensor, and more particularly, to an image sensor including an organic photoelectric conversion layer.

2. DISCUSSION OF RELATED ART

An image sensor is a device that captures an image and converts the image into electrical signals. The image sensor receives incident light and converts the incident light into electrical signals. The image sensor includes a plurality of image sensing pixels. Each pixel includes a corresponding photoelectric conversion region, in an image sensor that includes a silicon photoelectric conversion region, the light absorption area of the silicon photoelectric conversion region may decrease as, the size of an image sensing pixel decreases which may lead to sensitivity degradation. Accordingly, an image sensor has been developed in which a silicon photoelectric conversion region is replaced with a photoelectric conversion region formed using an organic material.

SUMMARY

Exemplary embodiments of the present inventive concepts include an image sensor that, provides improved sensitivity and high sensing speed.

According to an exemplary embodiment of the present inventive concepts, an image sensor includes a first substrate having a first surface and a second surface opposite to the first surface. The first substrate includes an active pixel region having a plurality of active pixels. A plurality of lower electrode structures is disposed on the second surface of the first substrate and corresponds to the plurality of active pixels. An upper electrode is disposed on the plurality of lower electrode structures. An organic photoelectric conversion layer is disposed between the plurality of lower electrode structures and the upper electrode. A second substrate is disposed on the first surface of the first substrate. A driving circuit configured to drive the plurality of active pixels is disposed on the second substrate. The plurality of lower electrode structures includes a first barrier layer, a reflective layer disposed on the first barrier layer and a second barrier layer disposed on the reflective layer.

According to another exemplary embodiment of the present inventive concepts, an image sensor includes a first substrate including an active pixel region having first, second and third active pixels. First, second and third lower electrode structures are disposed on the first substrate and respectively correspond to the first, second and third active pixels. An upper electrode is disposed on the first, second and third lower electrode structures. An organic photoelectric conversion layer is disposed between the first lower electrode structure and the upper electrode, between the second lower electrode structure and the upper electrode, and between the third lower electrode structure and the upper electrode. First, second and third color filter layers are disposed on the upper electrode and respectively correspond to the first, second and third active pixels. At least one of the first, second and third lower electrode structures includes a first barrier layer, a reflective layer disposed on the first barrier layer and a second barrier layer disposed on the reflective layer.

According to another exemplary embodiment of the present inventive concepts, an image sensor includes a first substrate having a first surface and a second surface opposite to the first surface. The first substrate includes an active pixel region having a plurality of active pixels. A plurality of lower electrode structures is disposed on the second surface of the first substrate and corresponds to the plurality of active pixels. Each of the plurality of lower electrode structures including a first barrier layer, a reflective layer, and a second barrier layer. An upper electrode is disposed on the plurality of lower electrode structures. An organic photoelectric conversion layer is disposed between the plurality of lower electrode structures and the upper electrode. A color filter layer is disposed on the upper electrode and corresponds to the plurality of active pixels. A second substrate is disposed on the first surface of the first substrate. A driving circuit configured to drive the plurality of active pixels is disposed on the second substrate. The first substrate does not include a photodiode.

According to another exemplary embodiment of the present inventive concepts, an image sensor includes a first substrate having a first surface and a second surface opposite to the first surface. The first substrate includes an active pixel region having a plurality of active pixels. A plurality of lower electrode structures is disposed on the second surface of the first substrate and corresponds to the plurality of active pixels. An upper electrode is disposed on the plurality of lower electrode structures. An organic photoelectric conversion layer is disposed between the plurality of lower electrode structures and the upper electrode. A second substrate is disposed on the first surface of the first substrate. A driving circuit configured to drive the plurality of active pixels is disposed on the second substrate. The plurality of lower electrode structures includes at least one first lower electrode structure having a first barrier layer, a reflective layer disposed on the first barrier layer and a second barrier layer disposed on the reflective layer. At least one second lower electrode structure is composed of a single material layer including a metal.

BRIEF DESCRIPTION OF THE DRAWINGS

Exemplary embodiments of the present inventive concepts will be more clearly understood from the following detailed description taken in conjunction with the accompanying drawings in which.

DETAILED DESCRIPTION OF EXEMPLARY EMBODIMENTS

Hereinafter, exemplary embodiments of the present inventive concepts will be described in detail with reference to the accompanying drawings.

Figure 1:
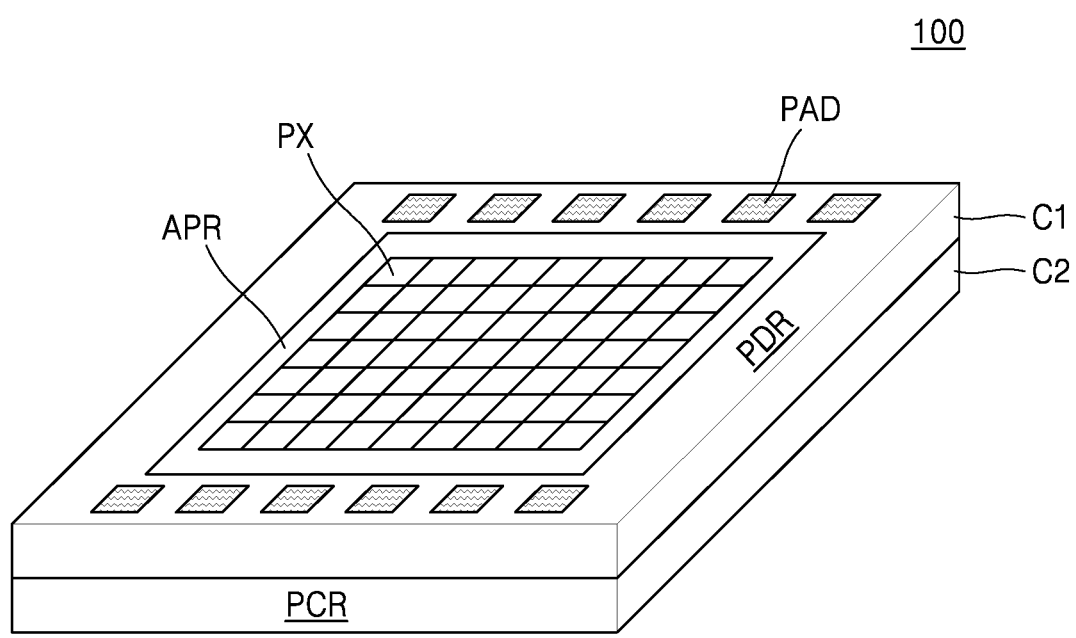
FIG. 1 is a perspective view of an image sensor according to an exemplary embodiment of the present inventive concepts.
Figure 2:
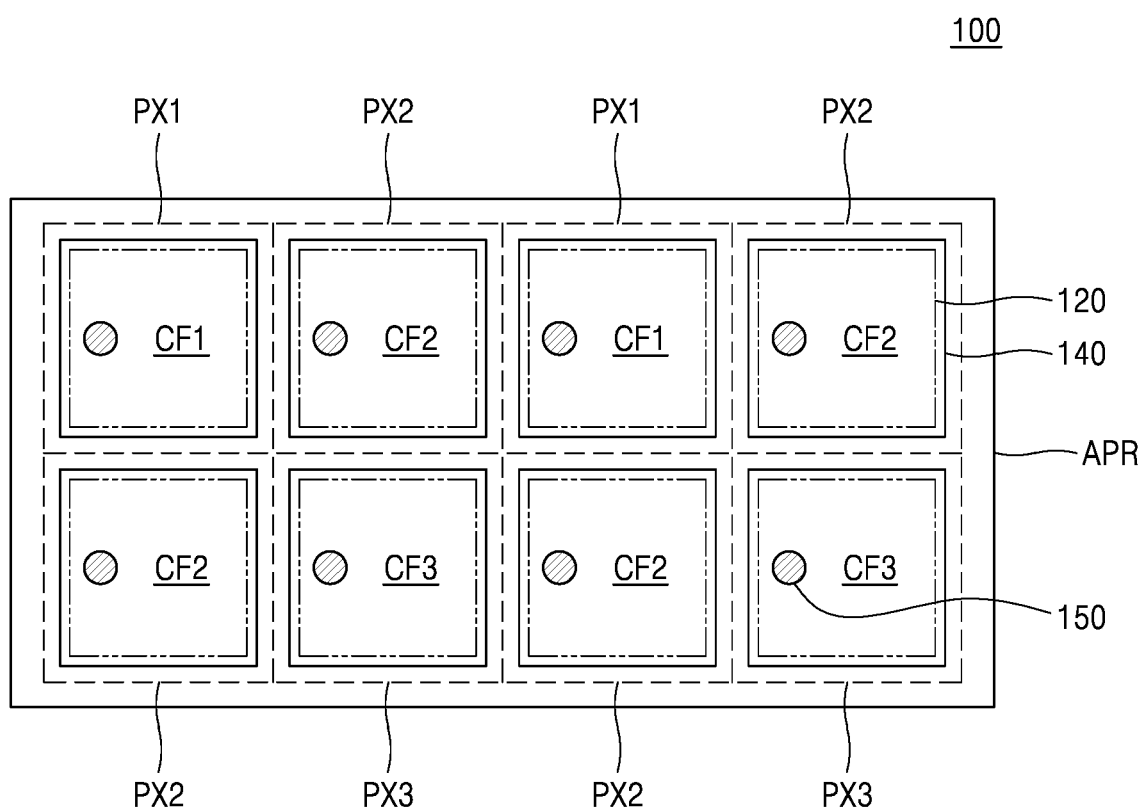
FIG. 2 illustrates a layout for an active pixel region in image sensor according to an exemplary embodiment of the present inventive concepts.
Figure 3:
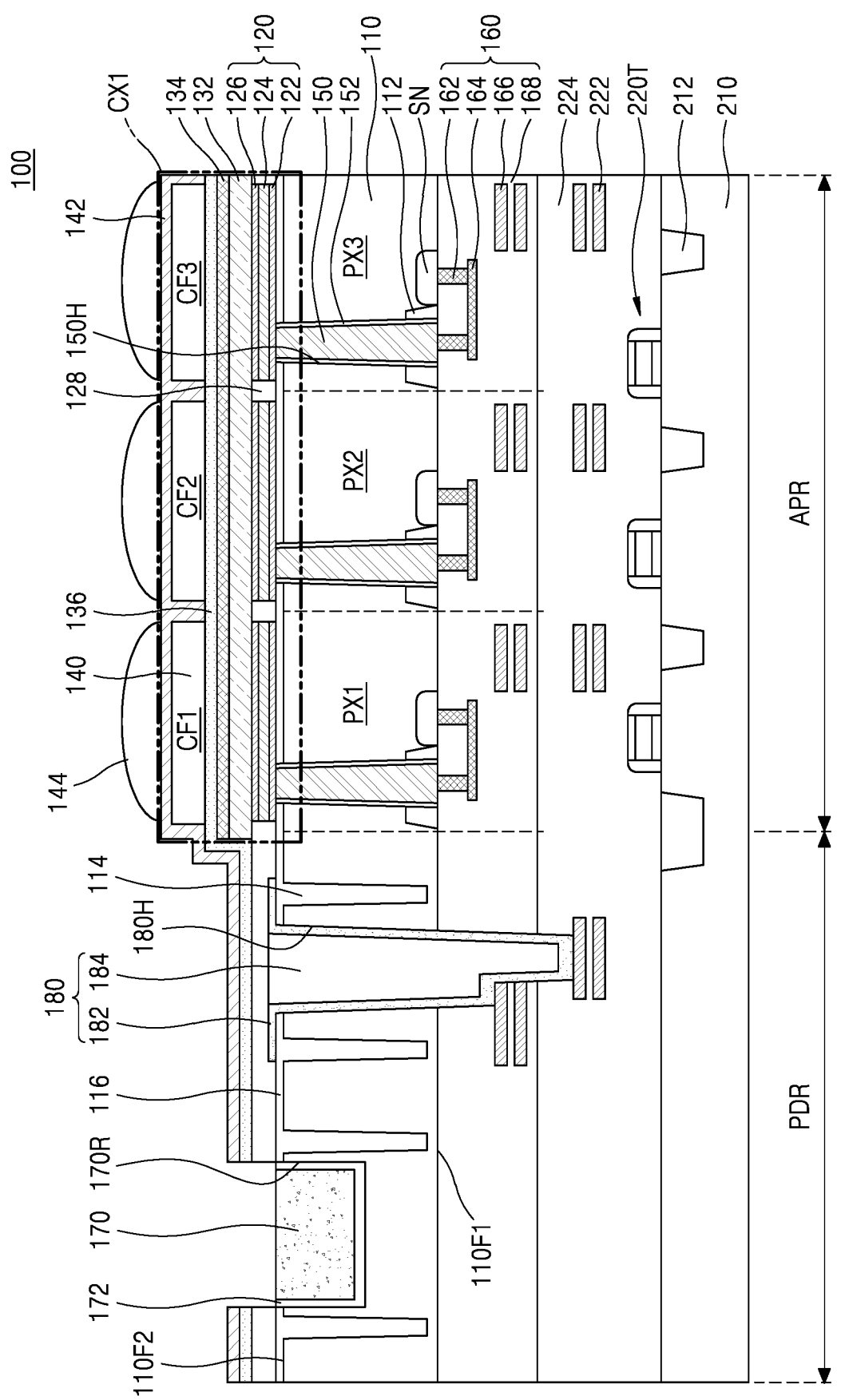
FIG. 3 is a cross-sectional view of an image sensor according to an exemplary embodiment of the present inventive concepts.
Figure 4:
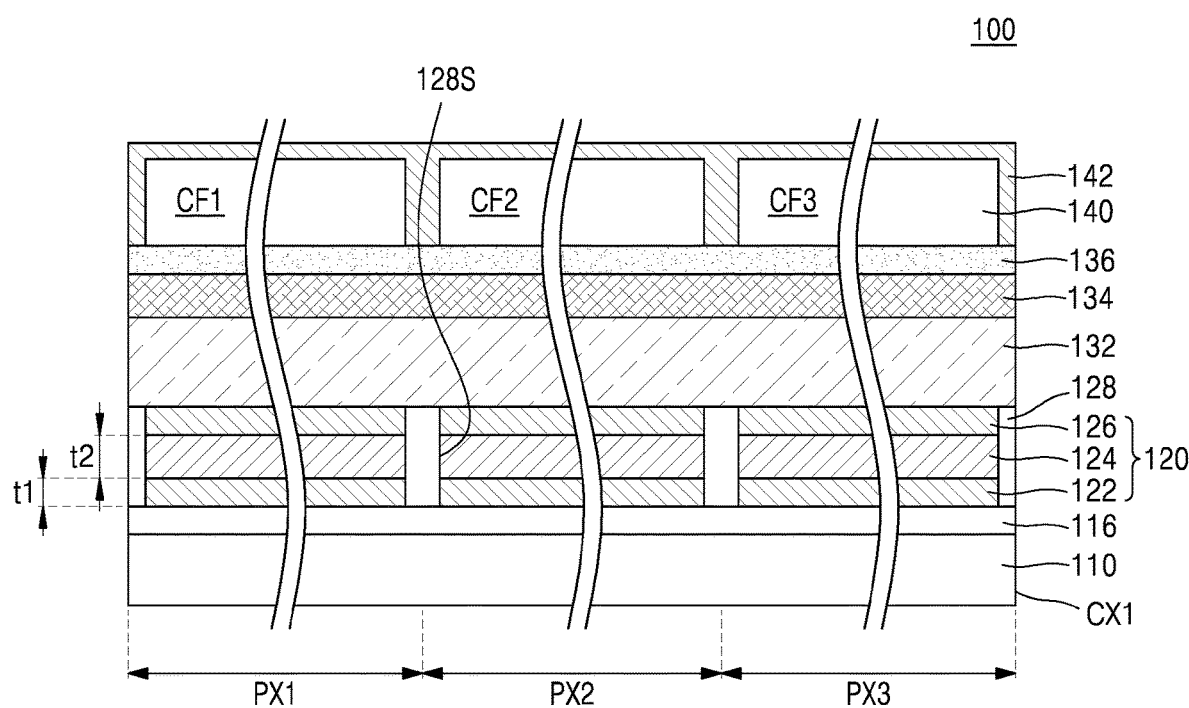
FIG. 4 is an enlarged cross-sectional view of portion CX1 of FIG. 3 according to an exemplary embodiment of the present inventive concepts.

FIG. 1 is a schematic perspective view of an image sensor 100 according to a exemplary embodiment of the present inventive concepts. FIG. 2 illustrates a layout for an active pixel region APR in the image sensor 100 according to an exemplary embodiment of the present inventive concepts. FIG. 3 is a cross-sectional view of the image sensor 100 according to an exemplary embodiment of the present inventive concept& FIG. 4 is an enlarged view of a portion CX1 of FIG. 3 according to an exemplary embodiment of the present inventive concepts.

Referring to the exemplary embodiments of FIGS. 1 to 4, the image sensor 100 may include a first chip C1 having an active pixel region APR and a pad region PDR adjacent to the active pixel region APR, and a second chip C2 having a driving circuit region PCR.

The active pixel region APR may be a region in which a plurality of active pixels PX are arranged. For example, as shown in the exemplary embodiment of FIG. 2, the active pixels PX may include first to third active pixels PX1 to PX3. In an exemplary embodiment, the first active pixel PX1 may be a region for sensing light in a first wavelength region, e.g., red light. The second active pixel PX2 may be a region for sensing light in a second wavelength region, e.g., green light. The third active pixel PX3 may be a region for sensing light in a third wavelength region, e.g., blue light. However, exemplary embodiments of the present inventive concepts are not limited thereto.

The pad region PDR may be a region in which a plurality of pads PAD are formed. The pad region PDR may be arranged to surround the active pixel region APR in a plan view. For example, as shown in the exemplary embodiment of FIG. 1, the active pixel region APR may be substantially rectangular-shaped and the pad region PDR may surround all four sides of the active pixel region APR. However, exemplary embodiments of the present inventive concepts are not limited thereto and in other exemplary embodiment, the active pixel region APR may have various different shapes and/or the pad region PDR may not surround at least one side of the active pixel region APR, The driving circuit region PCR may be a region in which driving transistors 220T for respectively driving the active pixels PX are arranged.

As shown in the exemplary embodiment of FIG. 3, the first chip C1 may include a first substrate 110, a plurality of lower electrode structures 120, an organic photoelectric conversion layer 132, an upper electrode 134, a color filter layer 140, a microlens 144, and a front side structure 160. The second chip C2 may include a second substrate 210, driving transistors 220T, wiring layers 222, and an insulating layer 224. The front side structure 160 of the first chip C1 may directly contact the insulating layer 224 of the second chip C2 and may be attached thereto. Since the front side structure 160 is attached to the insulating layer 224, the first chip C1 may be stacked vertically on the second chip C2.

The first substrate 110 may have a first surface 110F1 and a second surface 110F2, opposite to the first surface 110F1. For example, as shown in the exemplary embodiment of FIG. 3, the first surface 110F1 and the second surface 110F2 may be spaced apart in a thickness direction of the first substrate 110. The first substrate 110 may include a P-type semiconductor substrate. For example, the first substrate 110 may include a P-type silicon substrate, in an exemplary embodiment, the first substrate 110 including a semiconductor may include a P-type bulk substrate and a P-type or N-type epitaxial layer grown thereon. In another exemplary embodiment, the first substrate 110 may include an N-type bulk substrate and a P-type or N-type epitaxial layer grown thereon. In another exemplary embodiment, the first substrate 110 may include an organic material substrate.

A rear insulating layer 116 may be disposed on the second surface 110F2 of the first substrate 110. In an exemplary embodiment, the rear insulating layer 116 may include a metal oxide such as at least one compound selected from hafnium oxide, aluminum oxide, and tantalum oxide. In this exemplary embodiment, the rear insulating layer 116 may serve as a negative fixed charge layer. However, exemplary embodiments of the present, inventive concepts are not limited thereto and in another exemplary embodiment, the rear insulating layer 116 may include an insulating material such as at least one compound selected from silicon oxide, silicon nitride, and silicon oxynitride.

The lower electrode structures 120 may be disposed on the rear insulating layer 116, For example, as shown in the exemplary embodiment of FIG. 3, a lower surface of the lower electrode structures 120 may directly contact an upper surface of the rear insulating layer 116. The lower electrode structures 120 may be discrete lower elect-rode structures 120 that are spaced apart from each other in a direction parallel to an upper surface of the second surface 110F2 of the first substrate 110. As shown in the exemplary embodiment of FIG. 4, the lower electrode structures 120 may respectively be arranged in a plurality of separating spaces 128S defined by an insulating fence 128. The lower electrode structures 120 may respectively vertically overlap (e.g., in a thickness direction of the image sensor 100) a corresponding one of the plurality of active pixels PX. For example, the insulating fence 128 may have a mesh or grid shape in a plan view, and the lower electrode structures 120 are arranged in a matrix form within the separating spaces 128S defined by the insulating fence 128. In an exemplary embodiment, a top surface of each of the lower electrode structures 120 may be at the same level (e.g., distance from first surface 110F1 of the first substrate 110 in a thickness direction of the image sensor 100) with a top surface of the insulating fence 128.

Each of the lower electrode structures 120 may include a first barrier layer 122, a reflective layer 124, and a second barrier layer 126. For example, as shown in the exemplary embodiment of FIG. 4, the first barrier layer 122, the reflective layer 124, and the second barrier layer 126 may be sequentially stacked on the rear insulating layer 116 (e.g., in a thickness direction of the image sensor 100). In an exemplary embodiment, the first and second barrier layers 122 and 126 may each include at least one material selected from titanium (Ti), tantalum (Ta), tungsten (W), ruthenium (Ru), titanium nitride (TiN), tantalum nitride (TaN), and tungsten nitride (WN). The reflective layer 124 may include at least one material selected from, aluminum (Al), magnesium (Mg), silver (Ag), nickel (Ni), cobalt (Co), platinum (Pt), copper (Cu), and gold (Au).

According to exemplary embodiments, the first barrier layer 122 may have a first thickness t1 in a first direction perpendicular to the first surface 110F1 of the first substrate 110, and the reflective layer 124 may have a second thickness t2 that is larger than the first thickness t1 in the first direction. For example, in an exemplary embodiment, the first thickness t1 may be about 10 nm to about 500 nm, and the second thickness t2 may be about 50 nm to about 1000 nm. However, exemplary embodiments of the present inventive concepts are not limited thereto.

Since the lower electrode structures 120 may have a high reflectance for light in the entire visible region, light transmitted through the overlying organic photoelectric conversion layer 132 may be reflected by the lower electrode structures 120 towards the organic photoelectric conversion layer 132 and then absorbed back into the organic photoelectric conversion layer 132. In an exemplary embodiment, each lower electrode structure 120 may include TiN/Al/TiN or TaN/Al/TaN forming the first layer 122/reflective layer 124/second barrier layer 126, respectively. In this exemplary embodiment, the lower electrode structure 120 may have a light reflectance above 75% in a wavelength range from about 400 nm to about 700 nm. Characteristics related to light reflectance of the lower electrode structures 120 will be described in detail below with reference to FIG. 5.

As shown in the exemplary embodiment of FIG. 3, the insulating fence 128 may define the separating spaces 128S in the active pixel region APR and the insulating fence 128 may extend to the pad region PDR. As shown in the exemplary embodiment of FIG. 3, the insulating fence 128 may be arranged to cover the entire pad region PDR excluding a pad layer 170. However, exemplary embodiments, of the present inventive concepts are not, limited thereto. For example, in another exemplary embodiment, the insulating fence 128 may be arranged only in the active pixel region APR and may not extend to the pad region PDR, exemplary embodiment, the insulating fence 128 may include an oxide. However, exemplary embodiments of the present inventive concepts are not limited thereto.

The organic photoelectric conversion layer 132 may be disposed on the lower electrode structures 120. For example, as shown in the exemplary embodiment of FIG. 4, a lower surface of the organic photoelectric conversion layer 132 may directly contact upper surfaces of the second barrier layer 126 and the insulating fence 128. In an exemplary embodiment, the organic photoelectric conversion layer 132 may be positioned to vertically overlap the entirety of the plurality of active pixels PX (e.g., in a thickness direction of the image sensor 100).

In an exemplary embodiment, the organic photoelectric conversion layer 132 may include an organic material that absorbs light in a wavelength range of about 400 nm to about 1500 nm. The organic photoelectric conversion layer 132 may include a p-type semiconductor and an n-type semiconductor, and at least one of the p-type semiconductor or the n-type semiconductor may absorb light in the entire visible region. For example, the organic photoelectric conversion layer 132 may be a panchromatic photoelectric conversion material capable of causing photoelectric conversion at all wavelengths of red, blue, and green light. Alternatively, the organic photoelectric conversion layer 132 may be a photoelectric conversion material capable of causing photoelectric conversion at wavelengths of near-infrared or infrared light. However, exemplary embodiments of the present inventive concepts are not limited thereto.

The organic photoelectric conversion layer 132 is a layer in which a p-type semiconductor material and an n-type semiconductor material form a p-n junction (flat p-n junction) or a bulk heterojunction, and may be composed of a single layer or multiple layers. The organic photoelectric conversion layer 132 receives incident light to generate excitons and then separates the generated excitons into holes and electrons. The organic photoelectric conversion layer 132 may be formed of a single layer or multiple layers. The organic photoelectric conversion layer 132 may have a composition formed by various combinations including, for example, an intrinsic layer (hereinafter, referred to as an I layer), p-type layer/I layer. I layer/n-type layer, p-type layer/I-layer/n-type layer, or p-type layer/n-type layer.

For example, in an exemplary embodiment, the organic photoelectric conversion layer 132 may have a thickness of about 1 nm to about 500 nm. For example, the organic photoelectric conversion layer 112 may have a thickness of about 5 am to about 300 nm. The organic photoelectric conversion layer 132 may be sufficiently thick to effectively absorb light and separate and transfer holes and electrons and thereby improve a photoelectric conversion efficiency.

In an exemplary embodiment, the organic photoelectric conversion layer 132 may include at least two compounds selected from polyaniline, polypyrrole, polythiophene poly (p-phenylenevinylene), benzodithiophene, thienothiophene, poly [2-methoxy-5-(2'-ethyl-hexyloxy)-1,4-phenylene vinylene (MEH-PPV), poly (2-methoxy-5-(3,7-dimethyloctyloxy)-1,4-phenylene-vinylene (MDMO-PPV), pentacene, perylene; poly 3,4-ethylenedioxythiophene) (PEDOT), poly (3-alkylthiophene), poly((4,8-bis(octyloxy)benzo(1,2-b:4,5-b') dithiophene)-2,6-diyl-alt-(2-(dodecyloxy)carbonyl) thieno(3,4-b) thiophenediyl)-3,6-diyl) (PTB1), poly((4,8-bis (2-ethylhexyloxy) benzo [1, 2-b: 4,5-b']dithiophene)-2,6-diyl-alt-(2-((2-ethylhexyloxy) carbonyl)-3-fluorothieno [3,4-b] thiophenediyl)-3,6-diyl)) (PTB7), phthalocyanine, fin (II) phthalocyanine (SnPc), copper phthalocyanine, triarylamine, benzidine, pyrazoline, styrylamine, hydrazone, carbazole, thiophene, 3,4-ethylenedioxythiophene (EDOT), pyrrole, phenanthrene, tetracence, naphthalene, 1,4,5,8-naphthalene-tetracarboxylic dianhydride (NTCDA), tris-(8-hydoxyquionoline) aluminum (Alq3), fullerene (C60, C70, C74, C76, C78, C82, C84, C720, C860, etc.), fullerene derivatives such as 1-(3-methoxy-carbonyl) propyl-1-phenyl (6,6) C61(PCBM), C71-PCBM C84-PCBM, and bis-PCBM, inorganic semiconductors such as cadmium sulfide (CAS), cadmium telluride (CdTe), cadmium selenide (CdS), and zinc oxide (ZnO), and derivatives and copolymers thereof. However, exemplary embodiments of the present inventive concepts are not limited thereto.

The upper electrode 134 may be positioned on the organic photoelectric conversion layer 132, For example, as shown in the exemplary embodiment of FIG. 4, a lower surface of the upper electrode may directly contact an upper surface of the organic photoelectric conversion layer 132. In am exemplary embodiment, the upper electrode 134 may cover the entire top surface of the organic photoelectric conversion layer 132. In this exemplary embodiment, the upper electrode 134 may vertically overlap all the active pixels PX.

The upper electrode 134 may be a light-transmitting electrode, and, light transmitted through the upper electrode 134 may be absorbed in the organic photoelectric conversion layer 132, in an exemplary embodiment, the upper electrode 134 may include at least one compound selected from indium tin oxide (ITO), indium zinc oxide (IZO), ZnO, tin oxide (SnO), antimony (Sb)-doped tin oxide (ATO). Al-doped tin oxide (AlTO), and fluorine (F)-doped tin oxide (FTO).

A first passivation layer 136 may be positioned on the upper electrode 134. For example, as shown in the exemplary embodiment of FIG. 4, a lower surface of the first passivation layer 136 may directly contact an upper surface of the upper electrode 134. In an exemplary embodiment, the first passivation layer 136 may cover the entire upper electrode 134 and may extend to the pad region PDR. As shown in the exemplary embodiment of FIG. 3, the first passivation layer 136 may be arranged to cover the entire pad region PDR excluding the pad layer 170.

The color filter layer 140 may be arranged on the first passivation layer 136. For example, as shown in the exemplary embodiments of FIGS. 3-4, a lower surface of the color filter layer 140 may directly contact an upper surface of the first passivation layer 136. As shown in the exemplary embodiments of FIGS. 3-4, the color filter layer 140 may include first to third color filter layers CF1 to CF3. In an exemplary embodiment, the first color filter layer CF1 may include a material that transmits light in a first wavelength region, such as a red color filter. The second color filter layer CF2 may include a material that transmits light in a second wavelength region that is different from the first wavelength region, such as a green color filter. The third color filter layer CF3 may include a material that transmits light in a third wavelength region that is different from the first and second wavelength regions, such as a blue color filter. However, exemplary embodiments of the present inventive concepts are not limited thereto and the number of the color filters and the colors that the material of the color filters transmit may vary.

As shown in the exemplary embodiment of FIG. 2, the first to third color filter layers CF1 to CF3 may be arranged in a Bayer pattern. However, exemplary embodiments of the present inventive concepts are not limited thereto.

A second passivation layer 142 may be disposed on the color filter layer 140, and the microlens 144 may be disposed on the second passivation layer 142. For example, as shown in the exemplary embodiment of FIG. 3, the second passivation layer 142 may directly contact upper surfaces and sidewalls of the first to third color filter layers CF1 to CF3 and a lower surface of the second passivation layer 142 may directly contact an upper surface of the first passivation layer 136.

Micro through-vias 150 may be arranged in through-via holes 150H penetrating the first substrate 110 from the first surface 110F1 to the second surface 110F2. For example, as shown in the exemplary embodiment of FIG. 3, the micro through-vias 150 may penetrate the entire thickness of the first substrate. An upper end of each micro through-via 150 (e.g., a surface of the micro through-via 150 positioned at the same level as the second surface 110F2 of the first substrate 110) may be connected to each of the lower electrode structures 120. For example, as shown in the exemplary embodiment of FIG. 3, the upper end of each micro through-via 150 may directly contact a lower surface of the first barrier layer 122 of the lower electrode structures 120. The lower end of the micro through-via 150 may be connected to a contact plug 162 positioned on the first surface 110F1 of the first substrate 110. A liner 152 may be disposed on lateral sidewalls of the micro through-via 150 and may extend from the first surface 110F1 of the first substrate 110 to the second surface 110F2 of the first substrate 110.

Although FIG. 3 shows that each of the micro through-vias 150 directly contacts one of the lower electrode structures 120, exemplary embodiments of the present inventive concepts are not limited thereto. For example, in another exemplary embodiment, the micro through-via 150 may not directly contact the lower electrode structure 120 and a contact via may be interposed therebetween.

In an exemplary embodiment, each micro through-via 150 may be formed of a metal material or conductive metal nitride, such as at least one material selected from Cu, Al, Ti, TiN, and W. In another exemplary embodiment, the micro through-via 150 may be formed of polysilicon. In an exemplary embodiment, the liner 152 may include silicon oxide or silicon nitride.

In an exemplary embodiment, the micro through-via 150 may have a height (e.g., length in a thickness direction of the image sensor 100) of about 500 nm to about 2 micrometers (μm) in a first direction perpendicular to the first surface 110F1 of the first substrate 110. For example, the micro through-via 150 may have a height of about 800 nm to about 1.5 μm in the first direction. Since the micro through-via 150 has a relatively small height, the micro through-via 150 may be formed by filling the through-via hole 150H with a metal material.

For example, in an image sensor including a silicon photodiode according to the related art, a photodiode region corresponding to each pixel is formed within a substrate, and thus, a height of the substrate is relatively high. In this case, a process of forming a through-via hole with a high aspect ratio e.g., a through-via bole having a ratio of a depth to a width that is relatively high) in the substrate is relatively challenging. Since it is difficult to fill a metal material in the through-via hole with a high aspect ratio, a through-via is formed of polysilicon instead of the metal material. However, according to the exemplary embodiments of the present inventive concepts, since a photodiode region does not need to be formed in the first substrate 110, the first substrate 110 may have a relatively low height, and the micro through-via 150 may be easily formed in the through-via hole 150H by using a metal material having a relatively low electrical resistivity.

Although the exemplary embodiment of FIG. 2 illustrates an example in which one micro through-via 150 is arranged for each of the active pixels PX, exemplary embodiments of the present inventive concepts are not limited thereto and the arrangement of the micro through-via to the active pixels PX may vary. For example, in another exemplary embodiment, two micro through-vias 150 may be arranged for each of the active pixels PX in a spaced-apart manner.

Storage node regions SN may be arranged in the first substrate 110, each having a predetermined depth from the first surface 110F1. In an exemplary embodiment, each storage node region SN may be doped with n-type impurities. A region ranging from the lower electrode structure 120 to the storage node region SN may correspond to a floating diffusion region FD (See FIG. 6). Transistors constituting a readout circuit may be arranged on the first surface 110F1 of the first substrate 110. For example, the transistors may include a transfer transistor, a reset transistor, and a select transistor. However, exemplary embodiments of the present inventive concepts are not limited thereto.

A device isolation film 112 may be disposed on the first surface 110F1 of the first substrate 110 and may surround the micro through-via 150. For example, as shown in the exemplary embodiment of FIG. 3, the device isolation film 112 may directly contact outer surfaces of the liner 152. Furthermore, the device isolation film 112 may define an impurity region and the storage node region SN constituting the transistors in the first substrate 110.

The front side structure 160 may be disposed on the first surface 110F1 of the first substrate 110. The front side structure 160 may include a contact plug 162, a conductive line 164, a wiring layer 166, and an insulating layer 168. The micro through-vias 150 may be electrically connected to the storage node region SN through the contact plug 162 and the conductive line 164. Furthermore, the wiring layer 166 may electrically connect the storage node region SN to die transistors constituting a readout circuit, and the insulating layer 168 may be positioned on the first surface 110F1 of the first substrate 110 to cover the transistors and the wiring layer 166, Although the exemplary embodiment of FIG. 3 schematically shows the insulating layer 168 as a single layer, exemplary embodiments of the present inventive concepts are not limited thereto. For example, in an exemplary embodiment, the insluting layer 168 may be formed as a stack structure of multiple insulating layers.

A pad recess 170S may be formed in the pad region PDR and have a predetermined, height or depth from the second surface 110F2 of the first substrate 110. The pad layer 170 may be formed in the pad recess 170R. A pad barrier layer 172 may be interposed between the pad layer 170 and the first substrate 110. The pad layer 170 may not be covered by the insulating fence 128 and the first and second passivation layers 136 and 142.

In an exemplary embodiment, the pad layer 170 may be formed of a metal material or conductive metal nitride, such as at least one material selected from Cu, Al, Ti, TiIl, and W. The pad barrier layer 172 may include an insulating material.

A deep trench isolation film 114 may be further formed in the first substrate 110 in the pad region PDR. The deep trench isolation film 114 extends from the second surface 110F2 of the first substrate 110 towards the first surface 110F1. However, in an exemplary embodiment, the deep trench isolation film 114 may not penetrate the first surface 110F1 of the first substrate 110. However, exemplary embodiments of the present inventive concepts are not limited thereto.

The deep trench isolation, film 114 may not be disposed in the active pixel region APR. For example, in an image sensor including a silicon photodiode according to the related an, because a photodiode region corresponding to each pixel is formed within a substrate, it is necessary to form a deep trench isolation film that penetrates into the substrate or extends into the substrate to a relatively large depth so as to prevent interference or crosstalk from adjacent pixels. However, in exemplary embodiments of the present inventive concepts, a photodiode region is not formed in the first substrate 110. Therefore, the deep trench isolation film 114 may not be disposed in the active pixel region APR, such as being formed between two adjacent active pixels as M the related art.

An interconnect via hole 180H may be formed in the pad region PDR to penetrate the first substrate 110 from the second surface 110F2 of the first substrate 110 to the first surface 110F1. The wiring layer 222 on the second substrate 210 may be exposed at a bottom of the interconnect via hole 180H. The interconnect via structure 180 may be positioned in the interconnect via hole 180H and include a conductive layer 182 and a buried insulating layer 184. The interconnect via hole 180H may be formed to expose the wiring layer 166 included in the front side structure 160 and may penetrate the insulating layer 224 to expose the wiring layer 222 over the second substrate 210. The conductive layer 182 may be formed conformally along inner sidewalls of the interconnect via hole 180H, However, exemplary embodiments of the present inventive concepts are not limited thereto. For example, in another exemplary embodiment, the conductive layer 182 may extend further on the second surface 110F2 of the first substrate 110 in the pad region PDR to be connected to the pad layers 170.

The second substrate 210 may include an active region defined by a device isolation film 212. The driving transistors 220T may be disposed on the second substrate 210. Each of the driving transistors 220T may include a gate structure and an impurity region.

In an exemplary embodiment, the driving transistors 220T may be a plurality of complementary metal oxide semiconductor (CMOS) transistors for respectively providing specific signals to the active pixels PX in the active pixel region APR (e.g., the lower electrode structures 120, the upper electrode 134, or the transistors constituting the readout circuit) or for controlling output signals from the active pixels PX. For example, the driving transistors 220T may constitute various types of logic circuits such as a timing generator, a row decoder, a row driver, a correlated double sampler (CDS), an analog-to-digital convener (ADC), a latch, a column decoder. However, exemplary embodiments of the present inventive concepts are not limited thereto.

The wiring layers 222 connected to the driving transistors 220T and the insulating layer 224 for covering the wiring layers 222 may be arranged on the second substrate 210. As shown in the exemplary embodiment of FIG. 3, some of the wiring layers 222 may be electrically connected to the front side structure 160 on the first substrate 110 by the interconnect via structure 180. In an exemplary embodiment, the insulating layer 224 may directly contact the front side structure 160 or may be connected to the front side structure 160 via an adhesive layer.

Light reflectance of the lower electrode structures 120 will now be described in detail with reference to the exemplary embodiment of FIG. 5.

Figure 5:
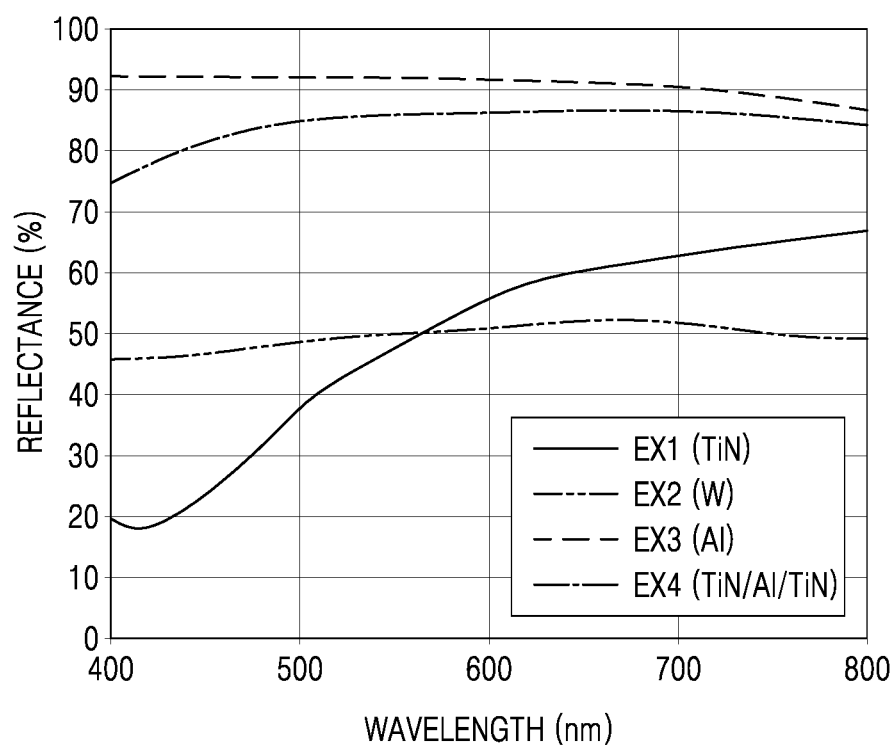
FIG. 5 is a graph of simulation results of light reflectance in a wavelength region of 400 nm to 800 nm using various lower electrode materials.

FIG. 5 is a graph illustrating simulation results of light reflectance in a wavelength region of 400 nm to 800 nm using various types of lower electrodes. As seen in the graph of FIG. 5, a lower electrode structure according to Embodiment 1 EX1 includes TiN, a lower electrode structure according to Embodiment 2 EX2 includes W, a lower electrode structure according to Embodiment 3 EX3 includes Al, and a lower electrode structure according to Embodiment 4 EX4 includes a TiN/Al/TiN stack structure. As seen in the graph of FIG. 5, the lower electrode structure according to Embodiment 4 EX4 exhibits a light reflectance above 75% in a wavelength range of 400 nm to 800 nm, (e.g., in the entire visible region).

In the related an, an image sensor including an organic photoelectric conversion layer has light-transmitting electrodes above and below the organic photoelectric conversions layer to sense one color (e.g., green) and has a photodiode region formed in a substrate to sense two colors (e.g., red and blue). However, when light passes through a lower electrode, which is a light-transmitting electrode, and reaches a storage node region or floating diffusion region, a light leakage phenomenon may occur.

However, according to the exemplary embodiments of the present inventive concepts shown in FIGS. 1 to 4, the lower electrode structures 120 with a high light reflectance may be arranged below the organic photoelectric conversion layer 132. Therefore, light reflected from the lower electrode structures 120 may be absorbed in the organic photoelectric conversion layer 132 and the sensitivity of the image sensor 100 may be improved. Furthermore, the lower electrode structures 120 may prevent light from being transmitted to the storage node region SN, thereby preventing light leakage.

In addition, in a front-side illuminated (FSI) image sensor having an organic photoelectric conversion layer formed on a front surface of a substrate in the related art, an active pixel region and a driving circuit region for driving the active pixel region need to be arranged on the front surface of the substrate. In this case, a total area of the active pixel region within the substrate may be relatively small.

However, according to the exemplary embodiments of the present inventive concepts shown in FIGS. 1-4, the organic photoelectric conversion layer 132 may be positioned over a back surface (e.g., the second surface 110F2) of the first substrate 110 and may be connected to the front side structure 160 on the first substrate 110 through the micro through-via 150. Furthermore, the driving transistor 220T arranged on the second substrate 210 may be connected to the active pixel PX formed on the first substrate 110 by using the interconnect via structure 180. Therefore, a total area of the active pixel region APR may be further increased.

Furthermore, because a photodiode region is not formed in the first substrate 110, the first substrate 110 may have a reduced height. Thus, it is possible to form the micro through-via 150 in the through-via hole 150H having a relatively low aspect ratio by using a metal material with a relatively low electrical resistivity. Since the micro through-via 150 has a low electrical resistivity, the image sensor 100 may provide a high sensing speed.

Figure 6:
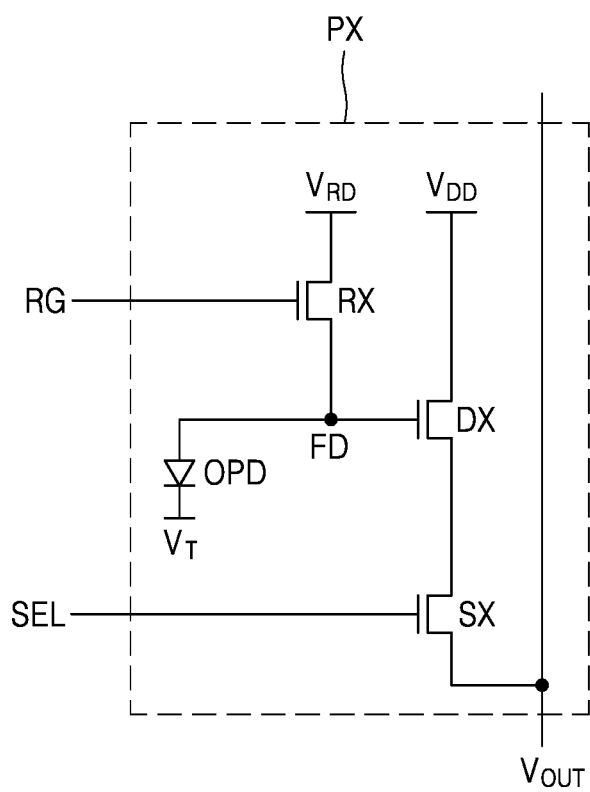
FIG. 6 is a circuit diagram of a readout circuit for an image sensor according to an exemplary embodiment of the present inventive concepts.

FIG. 6 is a circuit diagram of a readout circuit for an image sensor according to an exemplary embodiment of the present inventive concepts.

Referring to the exemplary embodiment of FIG. 6, a plurality of active pixels PX may be arranged in a matrix format. Each of the active pixels PX may include three logic transistors. In this exemplary embodiment, the logic transistors may include a reset transistor RX, a select transistor SX, and a drive transistor DX (or a source follower transistor).

Each of the active pixels PX may further include an organic photoelectric conversion element OPD and a floating diffusion region FD. The organic photoelectric conversion element OPD may be formed by the organic photoelectric conversion layer 132 and the upper electrode 134 and the lower electrode structures 120 respectively overlying and underlying the organic photoelectric conversion layer 132. The organic photoelectric conversion element OPD may generate and accumulate photo charges in proportion to the amount of light incident from the outside.

A gate terminal of the drive transistor DX may be coupled to the floating diffusion region FD. The drive transistor DX may operate as a source follower buffer amplifier due to electric charges accumulated in the floating diffusion region FD, and may amplify a potential change and output put voltage $V_{OUT}$ to a column line.

The select transistor SX may select one row of active pixels PX at a time, and when the select transistor SX is turned on, a power supply voltage $V_{DD}$ may be provided to a source electrode of the drive transistor DX. The select transistor SX may operate in response to a select control signal SEL input by a row driver, and may perform switching and addressing operations. When the select control signal SEL is applied by the row driver, an output voltage $V_{OUT}$ may be output to a column line connected to the select transistor SX.

The reset transistor RX may periodically reset electric charges accumulated in the floating diffusion region FD. A drain electrode of the reset transistor RX may be coupled to the floating diffusion region FD, and the reset transistor RX may reset a voltage of the floating diffusion FD to a readout voltage $V_{RD}$ in response to a reset control signal RG input by the row driver.

A cathode and an anode, of the organic photoelectric conversion element OPD may be coupled to the floating diffusion region FD and an upper electrode voltage $V_T$, respectively. The organic photoelectric conversion element OPD may use holes as major charge carriers, and a drain electrode of the reset transistor RX may be coupled to the readout voltage $V_{RD}$ that is different from the power supply voltage $V_{DD}$.

Figure 7:
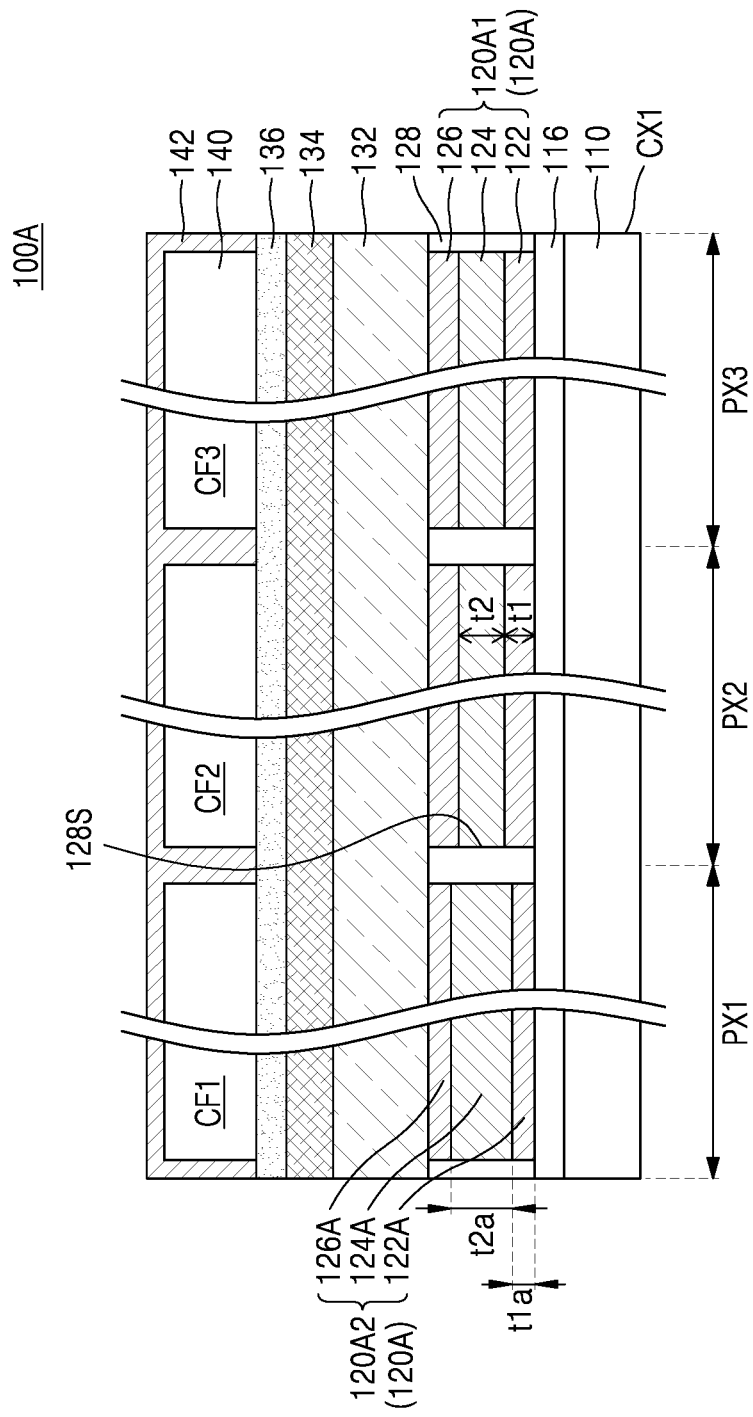
FIG. 7 is an enlarged cross-sectional view of portion CX1 of FIG. 3 according to another exemplary embodiment of the present inventive concepts.

FIG. 7 is a cross-sectional view of an image sensor 100A according to an exemplary embodiment of the present inventive concepts. FIG. 7 is an enlarged view of portion CX1 of FIG. 3 according to another exemplary embodiment of the present inventive concepts. In FIG. 7, the same reference numerals as in the exemplary embodiments of FIGS. 1 to 6 denote the same elements.

Referring to the exemplary embodiment of FIG. 7, a plurality of lower electrode structures 120A may include a first lower electrode structure 120A1 and a second lower electrode structure 120A2. At least one of the plurality of active pixels PX may include the first lower electrode structure 120A1 while other active pixels PX may include the second lower electrode structure 120A2.

For example, the first lower electrode structure 120A1 may have similar characteristics to those of the lower electrode structures 120 described with reference to the exemplary embodiments of FIGS. 1 to 4. For example, the first lower electrode structure 120A1 may have a stack structure including, a first barrier layer 122, a reflective layer 124, and a second barrier layer 126. The first barrier layer 122 may have a first thickness t1 and the reflective layer 124 may have a second thickness t2 that is larger than the first thickness t1.

The second lower electrode structure 120A2 may include a first barrier layer 122A, a reflective layer 124A, and a second barrier layer 126A that are consecutively stacked on each other (e.g., in a thickness direction of the image sensor 100A). The first barrier layer 122A may have a third thickness t1a, and the reflective layer 124A may have a fourth thickness t2a that is greater than the third thickness t1a. In an exemplary embodiment, the third thickness t1a may, be about 50% or less than the first thickness t1. The fourth thickness t2a of the reflective layer 124A of the second lower electrode structure 120A2 may be greater than the second thickness t2 of the reflective layer 124 of the first lower electrode structure 120A1. Since the fourth thickness t2a of the reflective layer 124A in the second lower electrode structure 120A2 is relatively large, light reflectance of the second lower electrode structure 120A2 may be greater than the light reflectance of the first lower electrode structure 120A1.

In an exemplary embodiment, the second lower electrode structure 120A2 may be arranged in a first active pixel PX1 while the first lower electrode structure 120A1 may be arranged in second and third active pixels PX2 and PX3, in an exemplary embodiment in which the first active pixel PX1 is a pixel region for sensing red light, the red light may be relatively easily transmitted into the first substrate 110. The second lower electrode structure 120A2 having a relatively high light reflectance may be used as a lower electrode of the first active pixel PX1 for sensing red light, and accordingly, the sensitivity of the image sensor 100A ma be improved.

Although the exemplary embodiment, of FIG. 7 shows a structure in which the second lower electrode structure 120A2 is arranged in the first active pixel PX1 while the first lower electrode structure 120A1 is arranged in the second and third active pixels PX2 and PX3, exemplary embodiments of the present inventive concepts are not limited thereto. For example, in another exemplary embodiment, the first lower electrode structure 120A1 may be arranged in the first and second active pixels PX1 and PX2 while the second lower electrode structure 120A2 may be arranged in the third active pixel PX3. In another exemplary embodiment, unlike in FIG. 7, the reflective layer 124 in the second active pixel PX2 may have a different thickness than the thickness of the reflective layer in the third active pixel PX3.

For example, an organic photoelectric conversion layer 132 may contain a panchromatic photoelectric conversion material that absorbs light in the entire visible region, and light absorption of the organic photoelectric conversion layer 132 in a first wavelength region may be different from light absorption thereof in a second or third wavelength region. In this exemplary embodiment, the first and second lower electrode structures 120A1 and 120A2 may be formed to have different light reflectances, thereby optimizing the sensitivity of each of the active pixels PX. Therefore, the image sensor 100A may achieve improved sensitivity.

Figure 8:
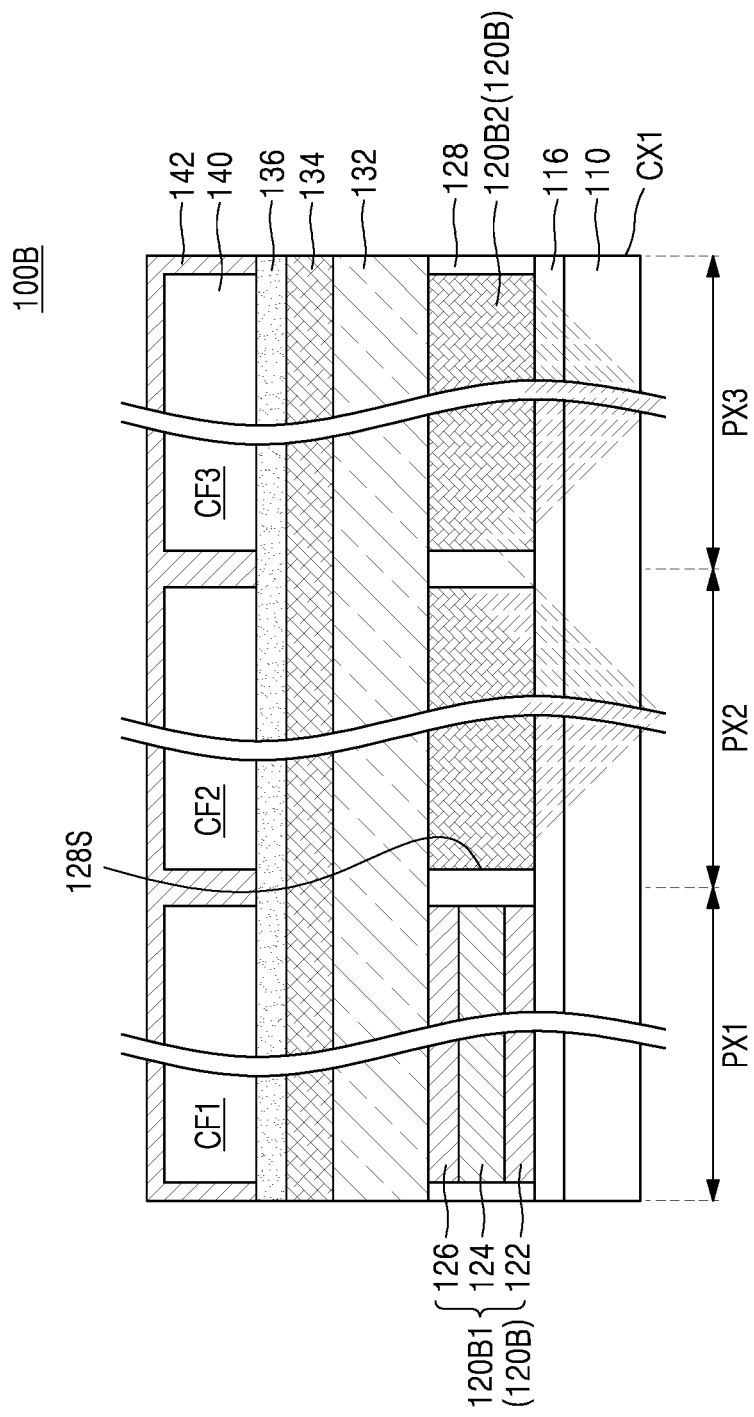
FIG. 8 is an enlarged cross-sectional view of portion CX1 of FIG. 3 according to another exemplary embodiment of the present inventive concepts.

FIG. 8 is a cross-sectional view of an image sensor 100B according to an exemplary embodiment of the present inventive concepts. FIG. 8 is an enlarged cross-sectional view of a portion corresponding to the portion CX1 of FIG. 3 according to another exemplary embodiment of the present inventive concepts. In FIG. 8, the same reference numerals as in the exemplary embodiments of FIGS. 1 to 7 denote the same elements.

Referring to the exemplary embodiment of FIG. 8, a plurality of lower electrode structures 120B may include a first lower electrode structure 120B1 acid a second lower electrode structure 120B2. At least ogle of the active pixels PX may include the first lower electrode structure 120B1 whether active pixels PX may include the second lower electrode structure 120B2.

For example, the first lower electrode structure 120B1 may have similar characteristics to those of the lower electrode structures 120 described with reference to the exemplary embodiments of FIGS. 1 to 4. For example, the first lower electrode structure 120B1 may have a stack structure including a first barrier layer 122, a reflective layer 124, and a second barrier layer 126 consecutively stacked (e.g., in a thickness direction of the image sensor 100B).

The second lower electrode structure 120B2 may be formed of a single material layer including a metal material. The second lower electrode structure 120B2 may have a top surface at the same level as a top surface of an insulating fence 128. The first lower electrode structure 120B1 may have a higher light reflectance than the second lower electrode structure 120B2.

In an exemplary embodiment, the second lower electrode structure 120B2 may include at least one material selected from Al, Mg, Ag, Ni, Co, Pt, Cu, and Au. However, exemplary embodiments of the present inventive concepts are not limited thereto. For example, in other exemplary embodiments, the second lower electrode structure 120B2 may include pit least one material selected from Ti, Ta, W, Ru, TiN TaN, and WN. In other exemplary embodiments, the second lower electrode structure 120B2 may include at least one compound selected from ITO, IZO, ZnO, SnO, ATO, AlTO, and FTO.

For example, as shown in the exemplary embodiment of FIG. 8, the first lower electrode structure 120B1 be arranged in a first active pixel PX1 and the second lower electrode structure 120B2 may be arranged in the second and third active pixels PX2 and PX3. In an exemplary embodiment in which the first active pixel PX1 is a pixel region for sensing red light, the red light may be relatively easily transmitted into the first substrate 110. The first lower electrode structure 120B1 having a relatively high light reflectance may be used as a lower electrode of the first active pixel PX1 for sensing red light. Therefore, the sensitivity of the image sensor 100B may be improved.

Although the exemplary embodiment of FIG. 8 shows a structure in which the first lower electrode structure 120B1 is arranged in the first active pixel PX1 and the second lower electrode structure 120B2 is arranged in the second and third active pixels PX2 and PX3, exemplary embodiments of the present inventive concepts are not limited thereto. For example, in another exemplary embodiment, the second lower electrode structure 120B2 may be arranged in the first and second active pixels PX1 and PX2 while the first lower electrode structure 120B1 may be arranged in the third active pixel PX3. In another exemplary embodiment, the second lower electrode structure 120B2 arranged in the second active pixel PX2 may be formed of a different material than the first lower electrode structure 120B1 in the third active pixel PX3. In at a exemplary embodiment, the second lower electrode structure 120B2 in different active pixels may include different materials from each other.

Figure 9:
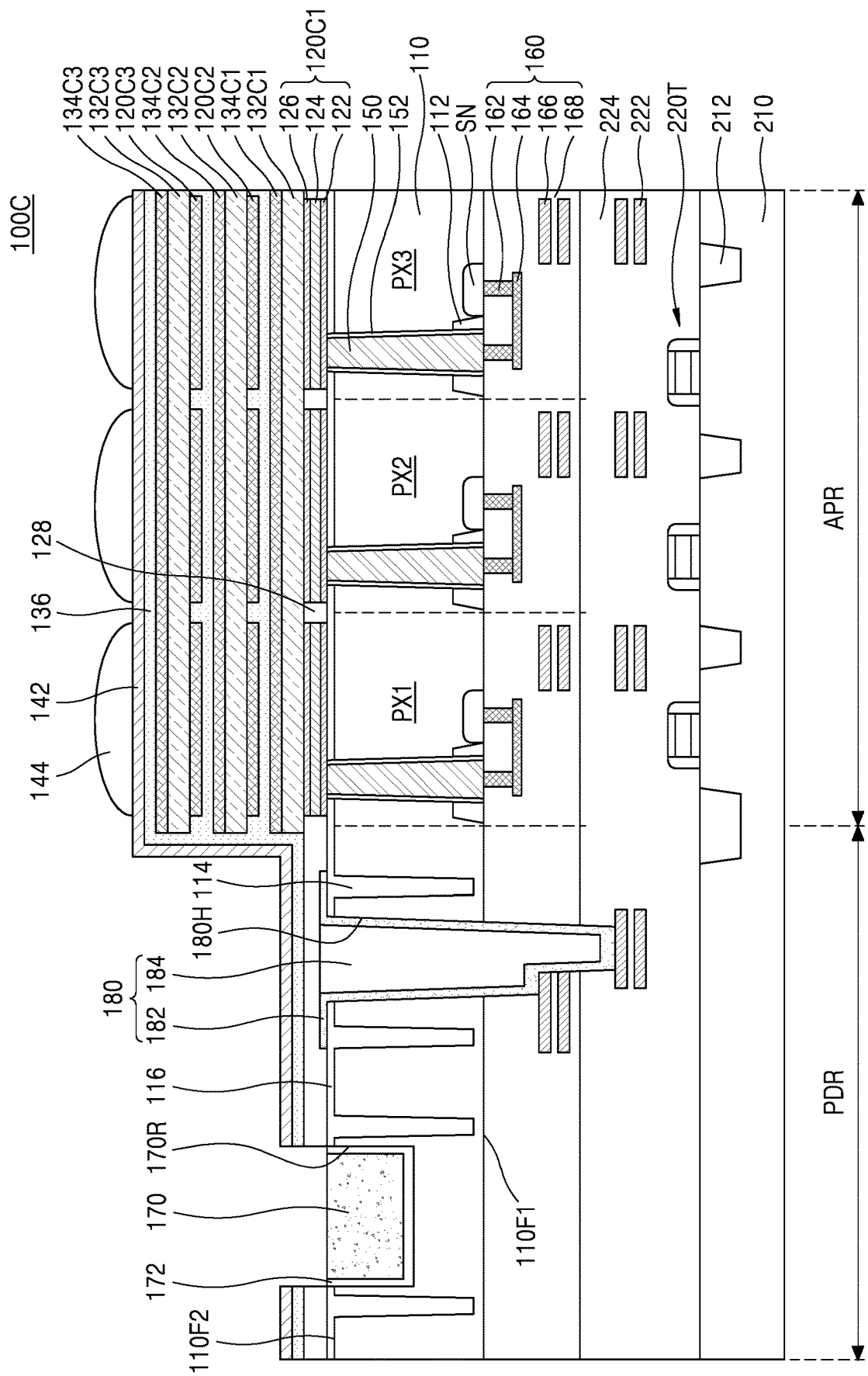
FIG. 9 is a cross-sectional view of an image sensor according to an exemplary embodiment of the present inventive concepts.

For example, an organic photoelectric conversion layer 132 may contain a panchromatic photoelectric conversion material that absorbs light in the entire visible region, and light absorption of the organic photoelectric conversion layer 132 in a first wavelength region may be different from light absorption thereof in a second or third wavelength region. In this exemplary embodiment, the first and second lower electrode structures 120B1 and 120B2 may be formed to have different light reflectances, thereby optimizing the sensitivity of each of the active pixels PX, Therefore, the image sensor 100B may achieve improved sensitivity, FIG. 9 is a cross-sectional view of an image sensor 100C according to an exemplary embodiment of the present inventive concepts. In FIG. 9, the same reference numerals as in the exemplary embodiments of FIGS. 1 to 8 denote the same elements.

Referring to the exemplary embodiment of FIG. 9, the image sensor 100C may include a plurality of first lower electrode structures 120C1, a first organic photoelectric conversion layer 132C1, a first upper electrode 134C1, a plurality of second lower electrodes 120C2, a second organic photoelectric conversion layer 132C2, a second upper electrode 134C2, a plurality of third lower electrodes 120C3, a third organic photoelectric conversion layer 132C3, and a third upper electrode 134C3 consecutively stacked on each other (e.g., in a thickness direction of the image sensor 100C).

The image sensor 100C: may not include the color filter layer 140 described with reference to the exemplary embodiments of FIGS. 1 to 8.

In an exemplary embodiment, the first to third organic photoelectric conversion layers 132C1 to 132C3 may be each formed of organic materials that cause a photoelectric conversion to occur with respect to light in a specific wavelength range that is different from each other. For example, in an exemplary embodiment, the first organic photoelectric conversion layer 132C1 may cause photoelectric changes only at wavelengths of red light, the second organic photoelectric conversion layer 132C2 may cause photoelectric changes only at wavelengths of green light, and the third organic photoelectric conversion layer 132C3 may cause photoelectric changes only at wavelengths of blue light.

In an exemplary embodiment, the first organic photoelectric conversion layer 132C1 may include a mixture of zinc phthalocyanine (ZnPc), titanyl-oxo-phthalocyanine (TiOPc), and Alq3, the second organic photoelectric conversion layer 132C2 may include a mixture of boron-subphthalocyanine chloride (SubPc), N, —N' dimethyl quinacridone (DMQA), dibutyl-substituted dicyanovinyl-terthiophene (DCV3T), etc., and the third organic photoelectric conversion layer 132C3 may include a mixture of Coumarin 30:C60 and tris(8-hydroxyquinolinato)aluminum (Alq3). However, exemplary embodiments of the present inventive concepts are not limited thereto.

The plurality of first lower electrode structures 120C1 may include any one of the plurality of lower electrode structures 120, 120A, and 120B described with reference to the exemplary embodiments of FIGS. 1 to 8. The second lower electrodes 120C2 and the third lower electrodes 120C3 may be each formed as light-transmitting electrodes. For example, the second lower electrodes and the third lower electrodes 120C2 and 120C3 may each include at least one compound selected from ITO, WO, ZnO, SnO, ATO, AlTO, and FTO.

In an exemplary embodiment the second lower electrodes 120C2 and the third lower electrodes 120C3 may be each connected to a micro through-via penetrating the first substrate 110. In addition, a wiring layer may be further arranged to be commonly connected to the first to third upper electrodes 134C1 to 134C3.

Figure 10:
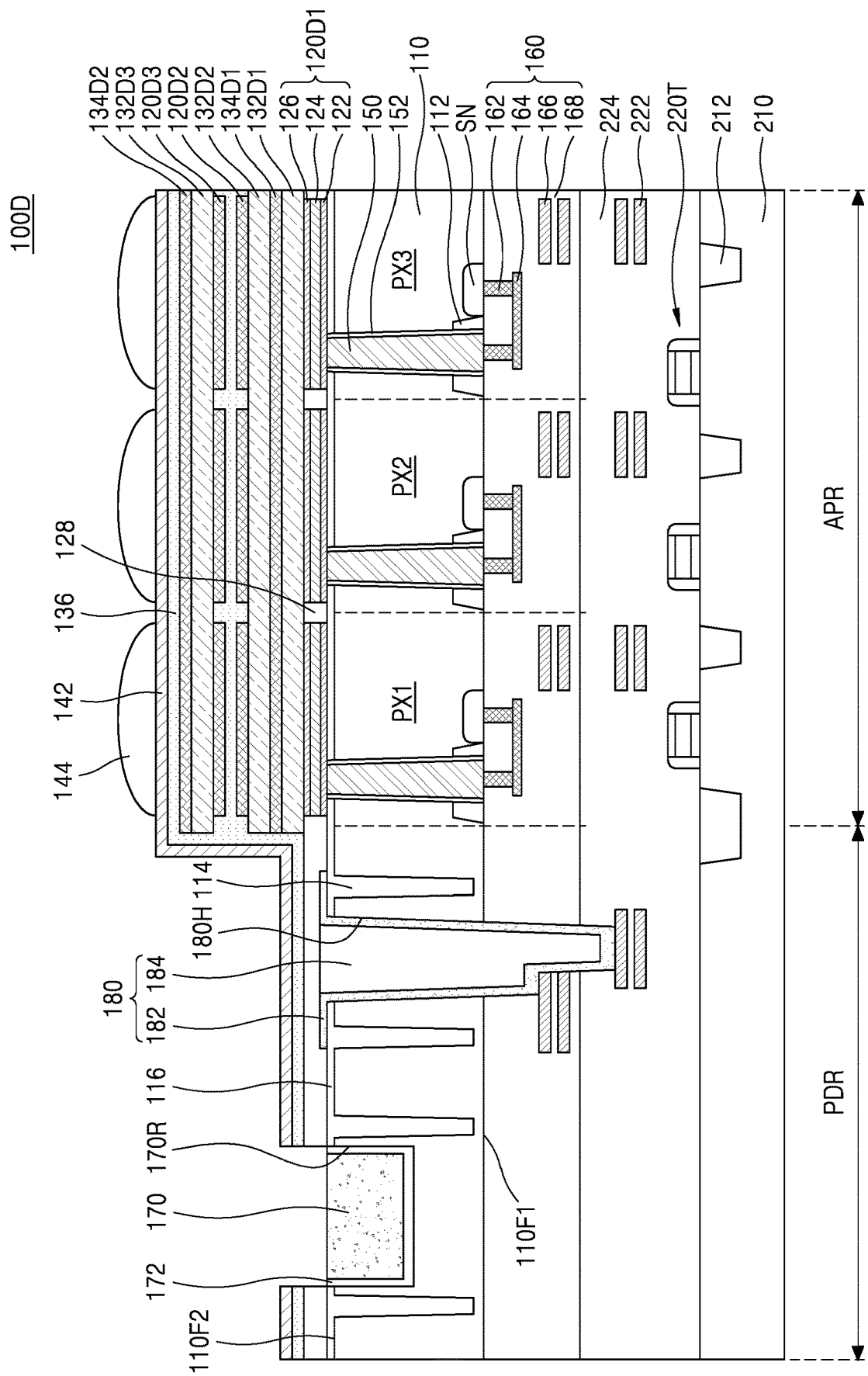
FIG. 10 is a cross-sectional view of an image sensor according to an exemplary embodiment of the present inventive concepts.

FIG. 10 is a cross-sectional view of an image sensor 100D according to an exemplary embodiment of the present inventive concepts. In FIG. 10, the same reference numerals as in the exemplary embodiments of FIGS. 1 to 9 denote the same elements.

Referring to the exemplary embodiment of FIG. 10, the image sensor 100D may include a plurality of first lower electrode structures 120D1, a first organic photoelectric conversion layer 132D1, a first common upper electrode 134D1, a second organic photoelectric conversion layer 132D2, a plurality of second lower electrodes 120D2, a plurality of third lower electrodes 120D3, a third organic photoelectric conversion layer 132D3, and an upper electrode 134D2 consecutively stacked on each other (e.g., in a thickness direction of the image sensor 100D). The first organic photoelectric conversion layer 132D1 may be disposed between the first lower electrode structures 120D1 and the first common upper electrode 134D1. The second organic photoelectric conversion layer 132D2 may be disposed between the first common upper electrode 134D1 and the second lower electrodes 120D2.

In an exemplary embodiment, the first to third organic photoelectric conversion layers 132D1 to 132D3 may be each formed of organic materials that cause a photoelectric conversion to occur with respect to light in specific wavelength range which is different from each other. The first lower electrode structures 120D1 may include any one of the plurality of lower electrode structures 120, 120A, and 120B described with reference to the exemplary embodiments of FIGS. 1 to 8. The second lower electrodes 120D2 and the third lower electrodes 12003 may be each formed as light-transmitting electrodes.

Figure 11:
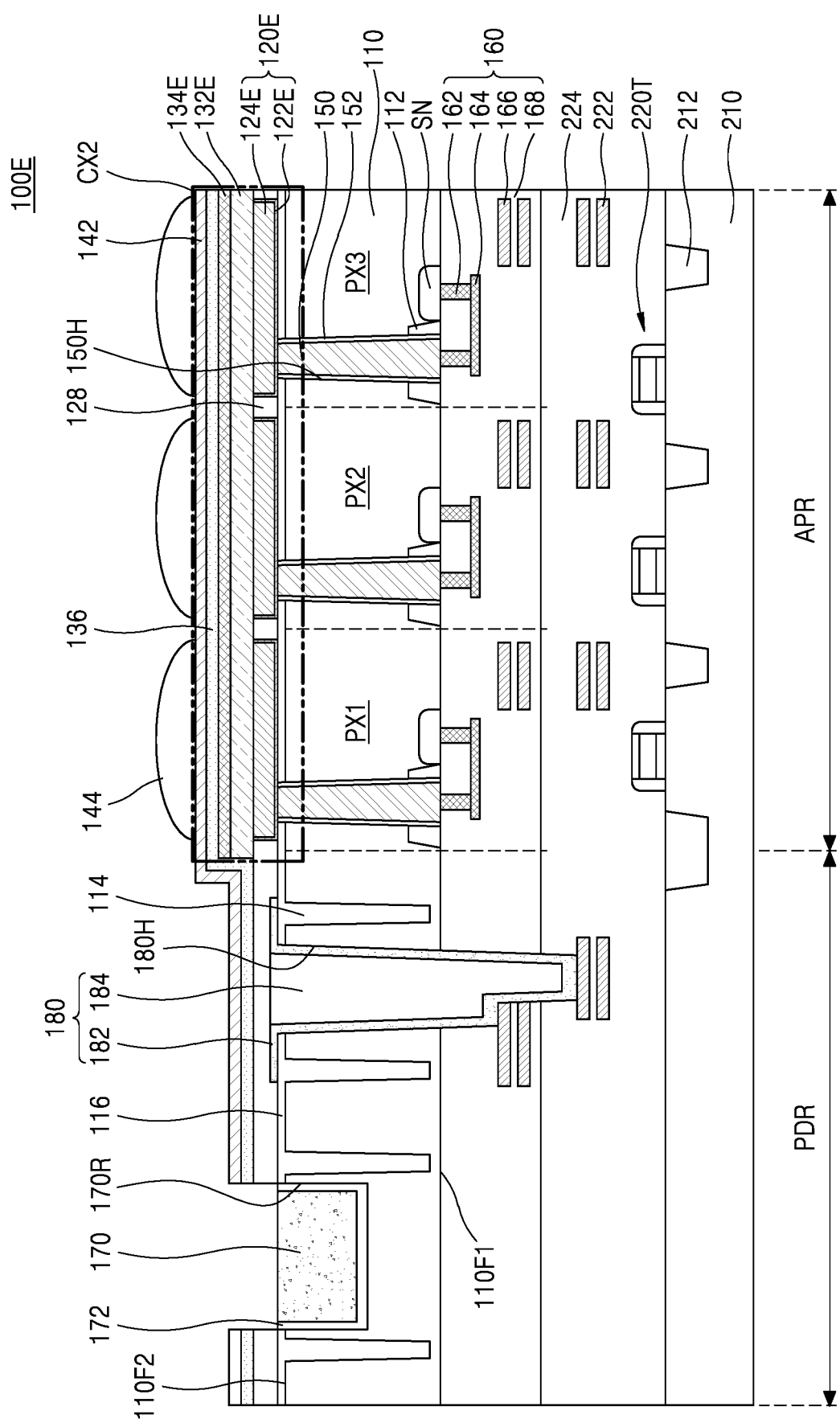
FIG. 11 is a cross-sectional view of an image sensor according to an exemplary embodiment of the present inventive concepts.
Figure 12:
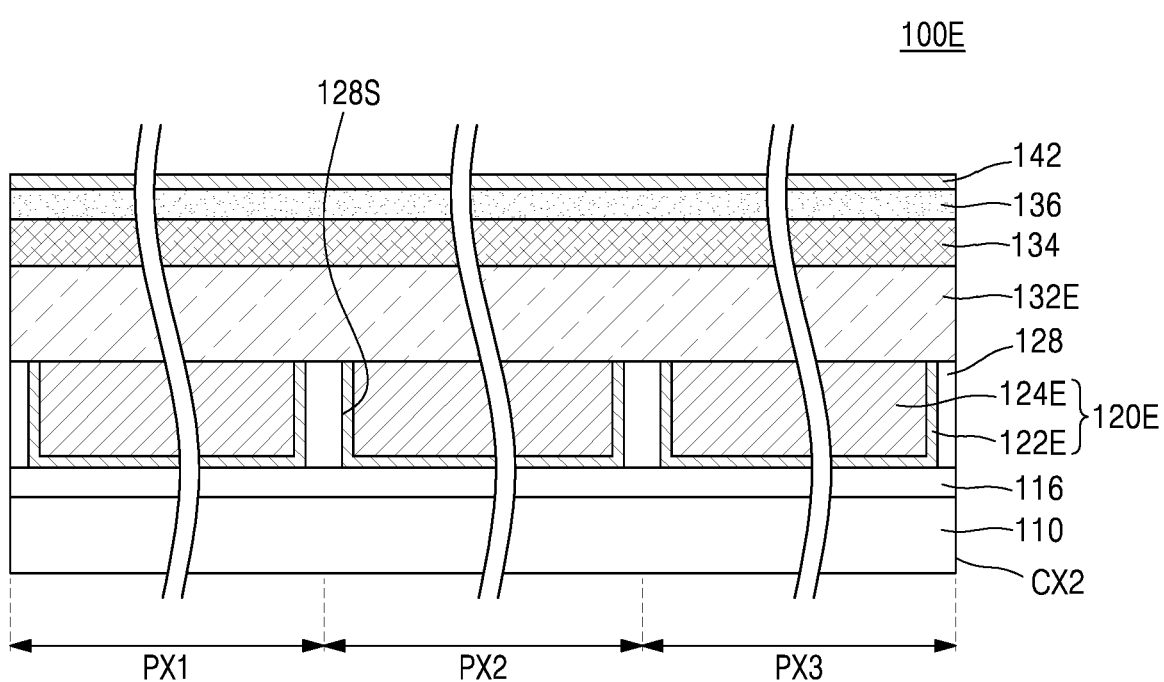
FIG. 12 is an enlarged view of portion CX2 of FIG. 1 according to an exemplary embodiment of the present inventive concepts.

FIG. 11 is a cross-sectional view of an image sensor 100E according to an exemplary embodiment of the present inventive concepts. FIG. 12 is an enlarged view of a portion CX2 of FIG. 11 according to an exemplary embodiment of the present inventive concepts. In FIGS. 11 and 12, the same reference numerals as in FIGS. 1 to 10 denote the same elements.

Referring to the exemplary embodiments of FIGS. 11 and 12, the image sensor 100E may include a plurality of lower electrode structures 120E, an organic photoelectric conversion layer 132E, and a common upper electrode 134E.

Each of the lower electrode structures 120E may include a barrier layer 122E and a reflective layer 124E. As shown in the exemplary embodiment of FIG. 12, the barrier layer 122E may be arranged to cover lateral side surfaces and a bottom surface of the reflective layer 124E. For example, the barrier layer 122E is conformally formed over a bottom surface and sidewalk of each of a plurality of separating spaces 128S defined by the insulating fence 128. The reflective layer 124E may be positioned on the barrier layer 122E to fill the inside of each separating space 128S.

In an exemplary embodiment, the barrier layer 122E may include at least one material selected from Ti, Ta W, Ru, TiN, TaN, and WN. In an exemplary embodiment, the reflective layer 124E may include Cu or an alloy including Cu.

In an exemplary embodiment, the organic photoelectric conversion layer 132E may include an organic material that absorbs light in an infrared or near-infrared region. For example, the organic photoelectric conversion layer 132E may include an organic material that absorbs light in a wavelength range from about 700 nm to about 2500 nm. For example, the organic photoelectric conversion layer 132E may include an organic material that absorbs light in a wavelength range of about 700 nm to about 1500 nm.

In an exemplary embodiment, the organic photoelectric conversion layer 132E may be formed of an organic film in which a p-type semiconductor material and an n-type semiconductor material form a p-n junction e.g., a flat p-n junction) or a bulk heterojunction. The organic film may be composed of a single film or multiple films.

In an exemplary embodiment, the p-type semiconductor material ma include a compound selected from DMQA and its derivatives, diindenoperylene, dibenzo {[f,f']-4,4',7,7'-tetraphenyl}diindeno[1,2,3-cd:1',2', 3'-lm]perylene, etc.

However, exemplary embodiments of the present inventive concepts are not limited thereto. The n-type semiconductor material may include a compound selected from DCV3T and its derivatives, perylene phthalocyanine and its derivatives, subphthalocyanine and its derivatives, boron dipyrromethene and its derivatives, etc. However, exemplary embodiments of the present inventive concepts are not limited thereto.

The organic photoelectric conversion layer 132E may have a composition selected, from various combinations such as an I layer, p-type layer/I layer, I layer/n-type layer, p-type layer/I-layer/n-type layer, and p-type layer/n-type layer. The layer may be a layer in which a p-type semiconductor compound and an n-type semiconductor compound are mixed at a ratio of about 1:100 to about 100:1. The p-type layer may include the p-type semiconductor compound. The n-type layer may include the n-type semiconductor compound.

According to an exemplary embodiment, the lower electrode structures 120E may have a high light reflectance for light in an infrared or near-infrared region. Due to the high light reflectance, infrared or near-infrared light transmitted through the overlying organic photoelectric conversion layer 132E may be reflected by the lower electrode structures 120E towards the organic photoelectric conversion layer 132E and absorbed back into the organic photoelectric conversion layer 132E. Therefore, the sensitivity of the image sensor 100E may be improved. Furthermore, the lower electrode structures 120E may prevent light from being transmitted to a storage node area SN, thereby preventing light leakage.

Figure 13:
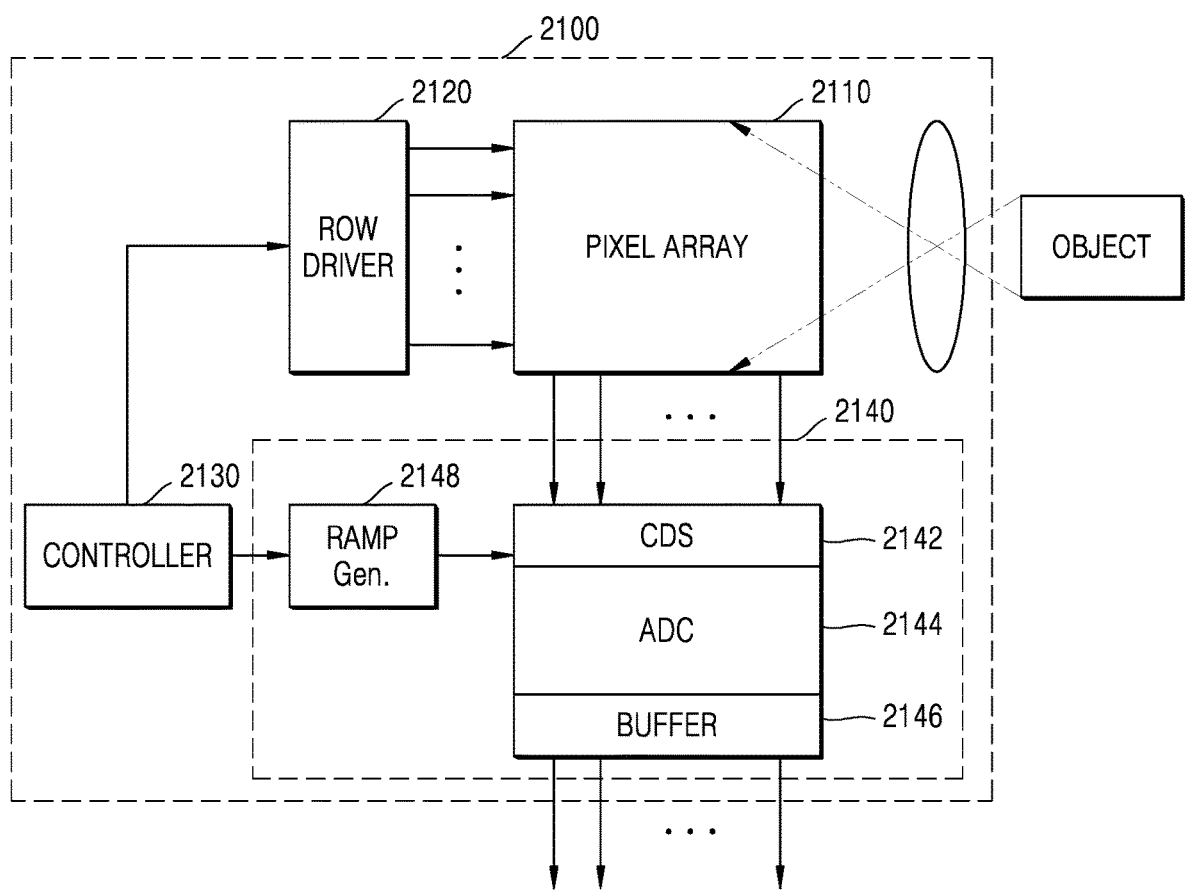
FIG. 13 is a block diagram of a configuration of an image sensor according to an exemplary embodiment of the present inventive concepts.

FIG. 13 is a block diagram of a configuration of an image sensor 2100 according to an exemplary embodiment of the present inventive concepts.

Referring to the exemplary embodiment of FIG. 13, the image sensor 2100 may include a pixel array 2110, a controller 2130, a row driver 2120, and a pixel signal processor 2140. The image sensor 2100 includes at least one of the image sensors 100, 100A, 100B, 100C, 100D, and 101E described with reference to the exemplary embodiments of FIGS. 1 to 12.

The pixel array 2110 may include a plurality of unit pixels arranged in a two-dimensional manner. Each unit pixel includes an organic photoelectric conversion element. The photoelectric conversion element may absorb light to generate a charge, and an electrical signal (e.g., output voltage) corresponding to the generated charge may be provided to the pixel, signal processor 2140 through a vertical signal line. Unit pixels in the pixel array 2110 may provide an output voltage, one row at a time, and thus, unit pixels in one row of the pixel array 2110 may be simultaneously activated in response to a select signal output from the row driver 2120. The selected row of unit pixels may provide an output voltage corresponding to the absorbed light to an output line of a corresponding line.

The controller 2130 may control the row driver 2120 such that the pixel array 2110 absorbs light to accumulate charges or temporarily stores the accumulated charges, and outputs an electric signal corresponding to the stored charges from the pixel array 2110. Furthermore, the controller 2430 may control the pixel signal processor 2140 to measure an output voltage provided by the pixel array 2110.

The pixel signal processor 2140 may include a CDS 2142, an ADC 2144, and a buffer 2146. The CDS 2142 may sample and hold the output voltage provided by the pixel array 2110. The CDS 2142 may sample both a specific noise level and a level of the generated output voltage, and output a level corresponding to a difference between these two levels. Furthermore, the CDS 2142 may receive a ramp signal generated by a ramp signal generator 2148, compare the ramp signal with the level corresponding to a difference between the level of the specific noise and the level of the generated output voltage, and output a comparison result.

The ADC 2144 may convert an analog signal corresponding to the level received from the CDS 2142 into a digital signal. The buffer 2146 may latch digital signals, and the latched digital signals may be sequentially output from the image sensor 2100 and transmitted to an image processor.

FIGS. 14 to 19 are cross-sectional views illustrating a method of manufacturing an image sensor 100 according to exemplary embodiments of the present inventive concepts. In FIGS. 14 to 19, the same reference numerals as in FIGS. 1 to 13 denote the same elements.

Figure 14:
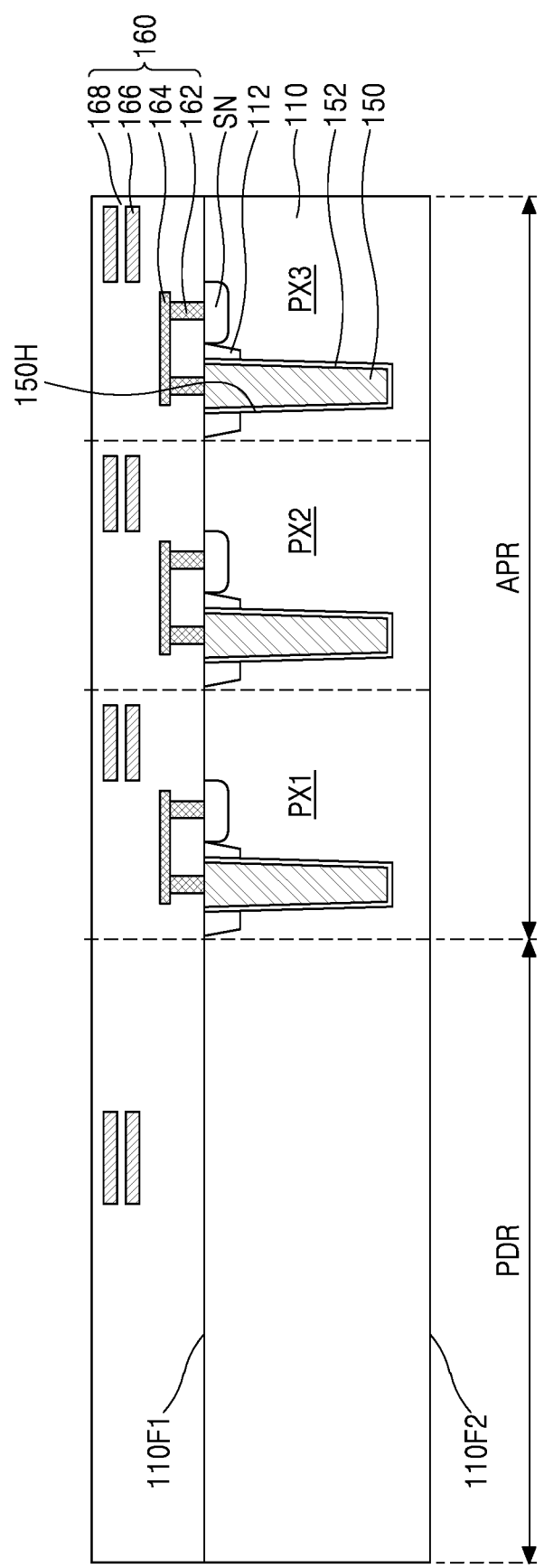
FIGS. 14 to 19 are cross-sectional views illustrating a method of manufacturing an image sensor according to exemplary embodiments of the present inventive concepts.

Referring to the exemplary embodiment of FIG. 14, a first substrate 110 having first and the second surfaces 110F1 and 110F2 opposite to each other is firmed.

A storage node region SN and a well region may be formed on the first surface 110F1 of the first substrate 110 by using an ion implantation process. For example, the storage node region SN may be doped with N-type impurities, and the well region may be doped with P-type impurities. However, exemplary embodiments of the present inventive concepts are not limited thereto.

A device isolation trench may then be formed to have a predetermined depth from the first surface 110F1 of the first substrate 110 and may be filled with an insulating material to form a device isolation film 112.

A through-via hole 150H may then be formed to extend from the first surface 110F1 of the first substrate 110 into the first substrate 110 towards the second surface 110F2 of the first substrate 110. A liner 152 and a micro through-via 150 may then be sequentially formed in the through-via hole 150H.

A front side structure 160 including a contact plug 162, a conductive line 164, a wiring layer 166, and an insulating layer 168 may then be formed. For example, in an exemplary embodiment, the front side structure 160 may be formed by forming a conductive layer on the first surface 110F1 of the first substrate 110, patterning the conductive layer, and forming an insulating layer to cover the patterned conductive layer. In an exemplary embodiment, the micro through-via 150 may be electrically coupled to the storage node region SN via the contact plug 162 and the conductive line 164.

Figure 15:
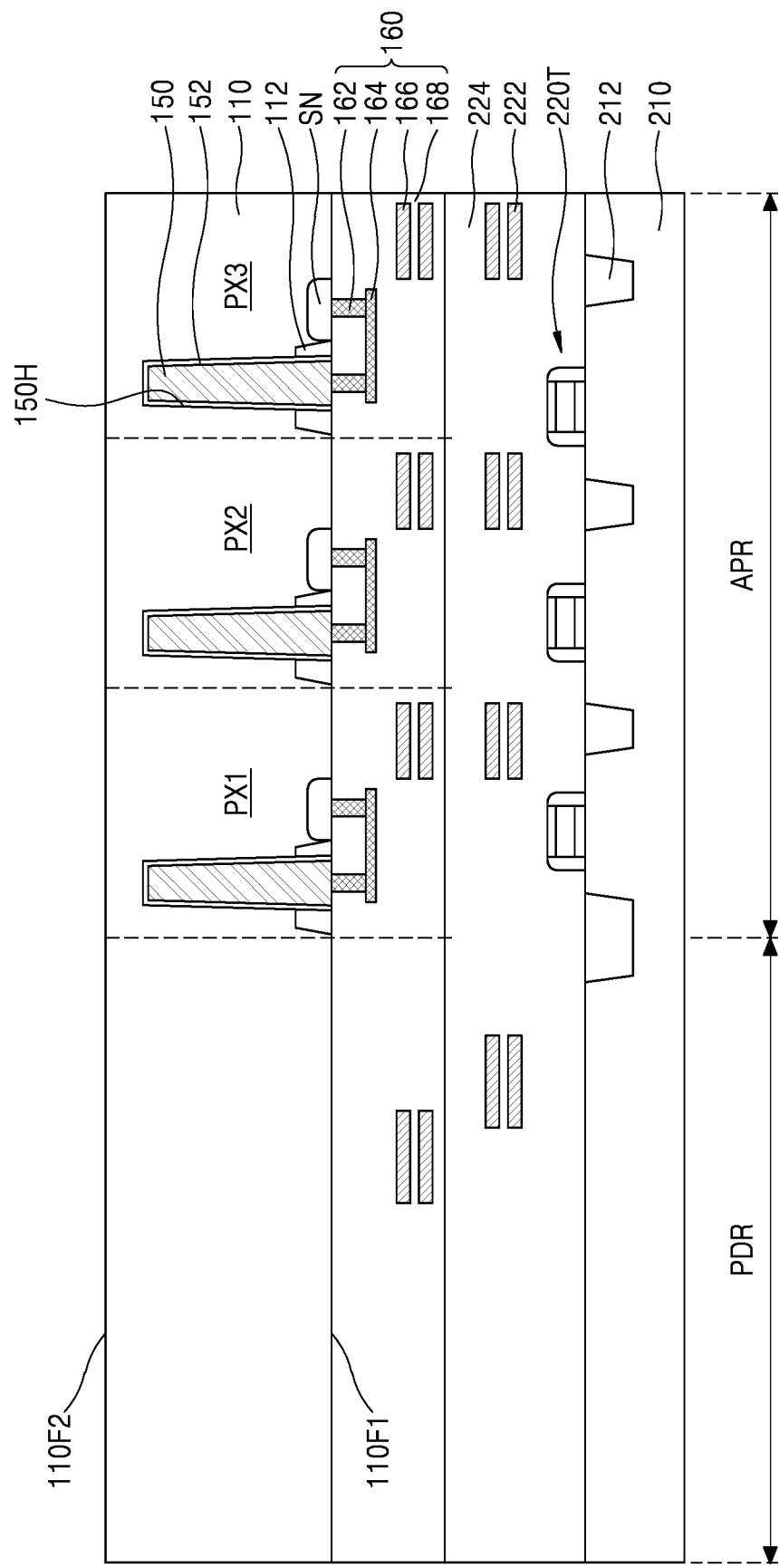

Referring to the exemplary embodiment of FIG. 15, a second substrate 210 is formed. A device isolating film 212 is formed on the second substrate to define an active region. Driving transistors 220T may then be formed on the second substrate 210. Subsequently, wiring layers 222, and an insulating layer 224 covering the wiring layers 222 may be formed on the second substrate 210. For example, in an exemplary embodiment, the wiring layers 222 and insulating layer 224 may be formed by forming a conductive layer on the second substrate 210, patterning the conductive layer, and forming an insulating layer to cover the patterned conductive layer.

The second substrate 210 may then be bonded to the first substrate 110. For example, in an exemplary embodiment, the second substrate 210 may be attached to the first substrate 110 by using an oxide-oxide direct bonding method in which the insulating layer 168 directly contacts the insulating layer 224.

Figure 16:
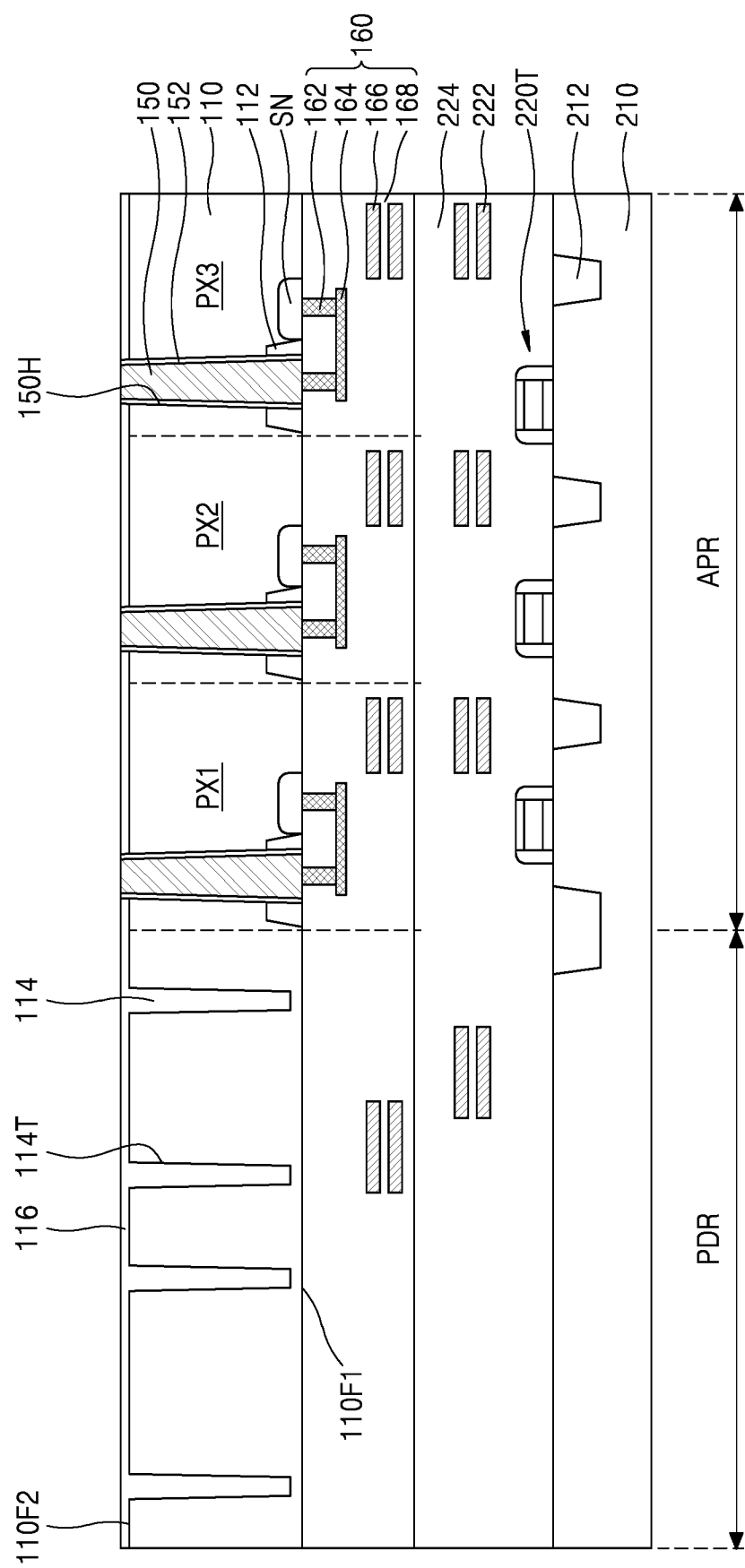

Referring to the exemplary embodiment of FIG. 16, the micro through-via 150 may be exposed to the second surface 110F2 of the first substrate 110 by removing a portion of the first substrate 110 having a predetermined thickness length in a first direction perpendicular to the first surface 110F1 of the first substrate 110) from the second surface 110F2.

A mask pattern may then be formed on the second surface 110F2 of the first substrate 110. A portion of the first substrate 110 in the pad region PDR may be etched from the second surface 110F2 using the mask pattern as an etch mask to form a deep trench 114T.

In an exemplary embodiment, an insulating film may then be formed on the second surface 110F2 of the first substrate 110 to fill the deep trench 114T. An upper portion of the insulating film may be planarized until the second surface 110F2 of the first substrate 110 is exposed to form a deep trench isolation film 114.

A rear insulating layer 116 may then be formed of an insulating material on, the second surface 110F2 of the first substrate 110, In an exemplary embodiment, the rear insulating layer 116 may be formed by using a chemical vapor deposition (CND) process, an atomic layer deposition (ALD) process, etc. According to another exemplary embodiment, the rear insulating layer 116 may be simultaneously formed during die process liar forming the deep trench isolation film 114.

Figure 17:
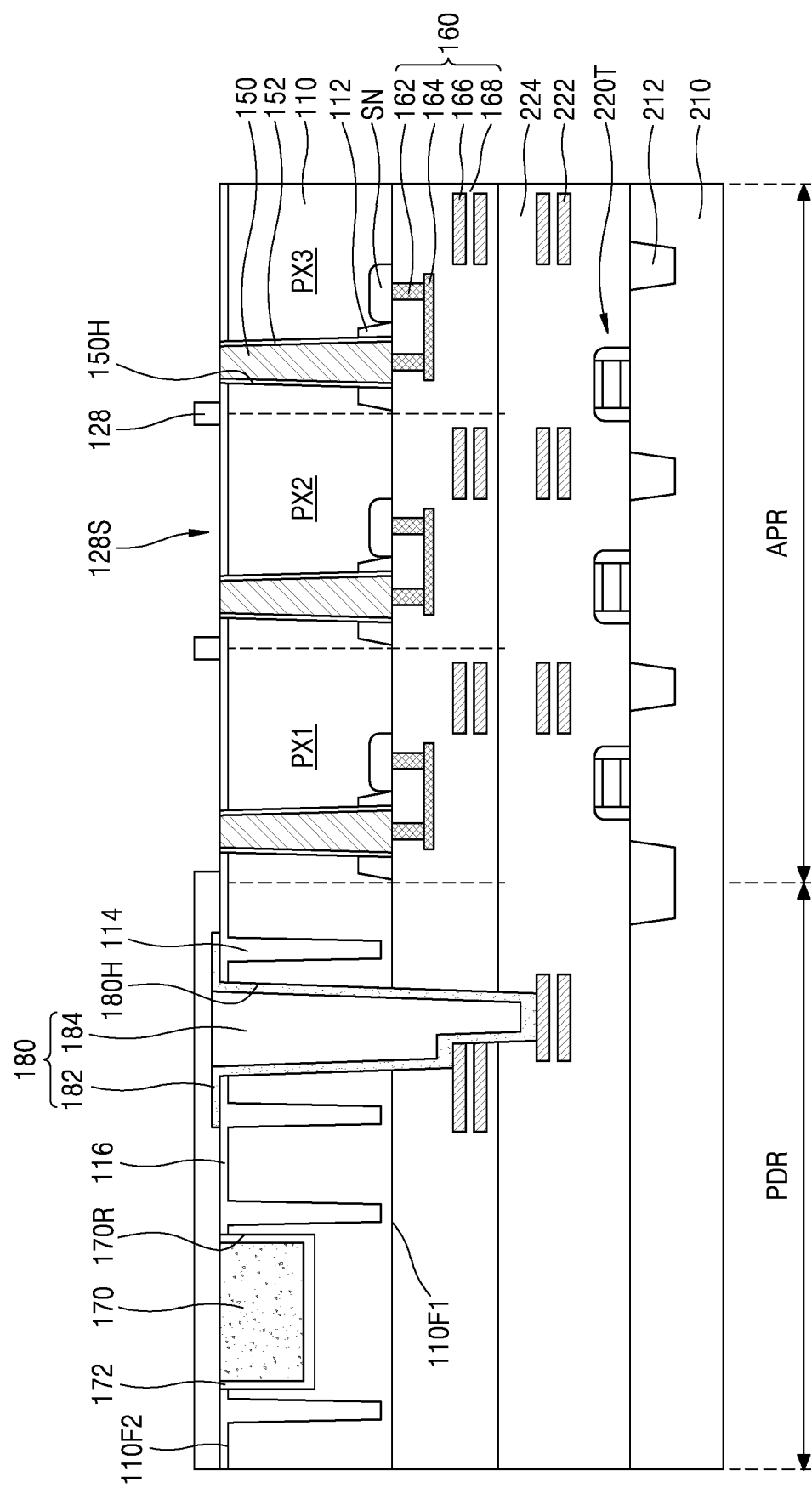

Referring to the exemplary embodiment of FIG. 17, a mask pattern may be formed on the rear insulating layer 116, The rear insulating layer 116 and the lint substrate 110 may then be etched using the mask pattern as an etch mask to form a pad recess 170S. Thereafter, the first substrate 110, the front side structure 160, and a portion of the insulating layer 224 may be etched to form an interconnect via hole 180H.

A conductive layer 182 and a buried insulating layer 184 may then be formed in the interconnect via hole 180H. In an exemplary embodiment, the conductive layer 182 may be formed of a metal material such as at least one material selected from Ti, TiN, Ta, TaN, TiW, W, Al, Co, nickel Ni, and Cu. In an exemplary embodiment, the conductive layer 182 may be formed in the interconnect via hole 180H by using a CVD or ALD process. The conductive layer 182 may be formed to be electrically connected to the wiring layer 222 at a bottom of the interconnect via hole 180H.

A pad barrier layer 172 and a pad layer 170 may then be formed in the pad recess 170R. In an exemplary embodiment, the pad layer 170 may be form-d of a metal material such as at least one material selected by W, Al, Co Ni, and Cu. In an exemplary embodiment, the pad layer 170 may be formed in the pad recess 170R by using a CVD process, an ALD process, or a plating process.

An insulating layer may then be formed over the second surface 110F2 to cover the pad layer 170, an interconnect via structure 180, and the rear insulating layer 116. The insulating layer may then be patterned to form an insulating fence 128 defining a plurality of separating spaces 128S in the active pixel region APR. The upper surface of the micro through via 150 may be exposed by the plurality of separating spaces 128S.

Figure 18:
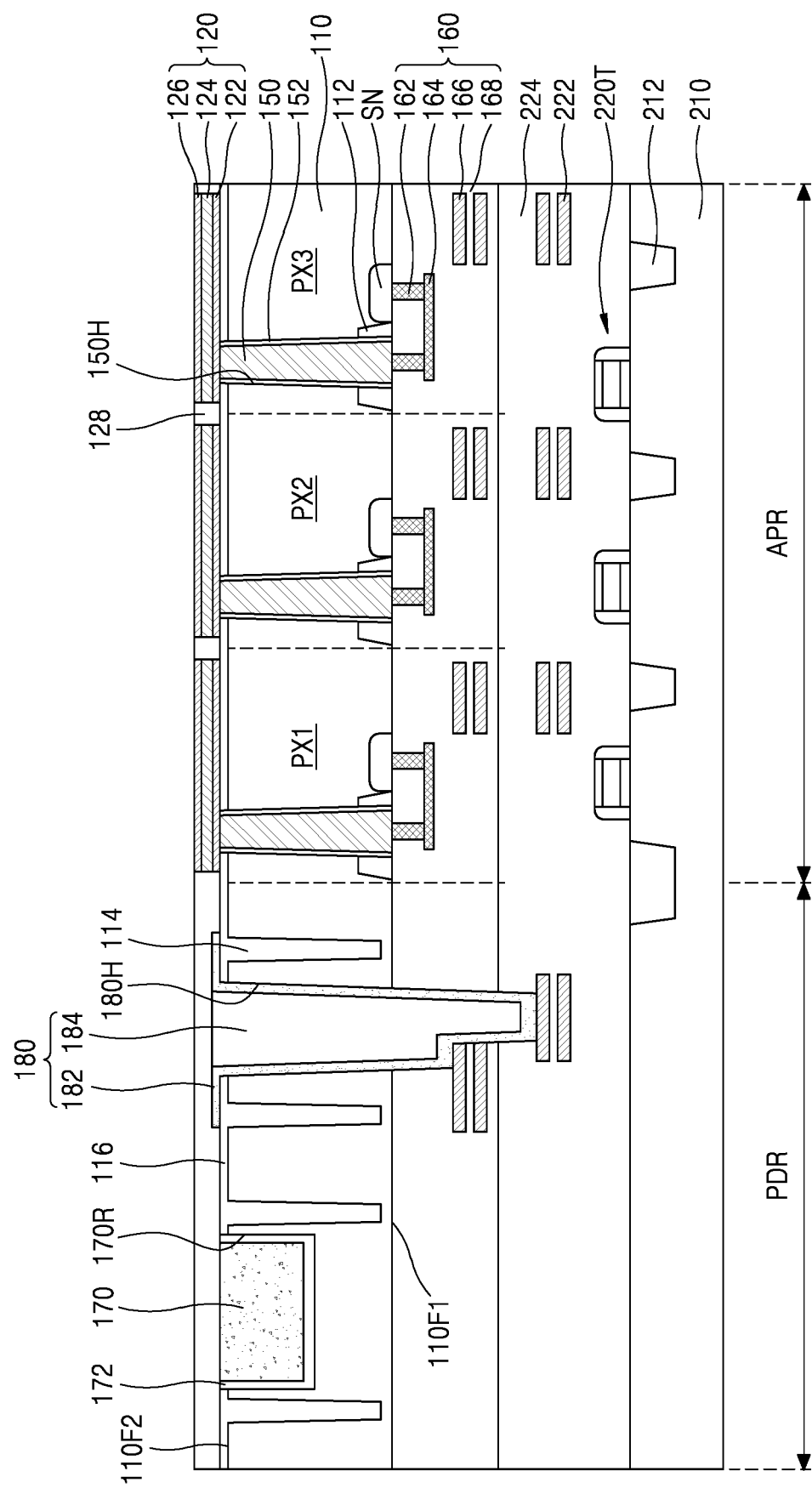

Referring to the exemplary embodiment of FIG. 18, a first barrier layer 122, a reflective layer 124, and a second barrier layer 126 may be sequentially formed in the separating spaces 128S (e.g., in a direction of a thickness of the image sensor 100) to form a plurality of lower electrode structures 120.

In an exemplary embodiment, the lower electrode structures 120 may be formed by damascene process. For example, after sequentially forming the first barrier layer 122, the reflective layer 124, and the second barrier layer 126 in the separating spaces 128S, unnecessary material layers formed on the insulating, fence 128 may be planarized to form the lower electrode structures 120. In this exemplary embodiment, a top surface of the insulating fence 128 may be coplanar with a top surface of each of the lower electrode structures 120 (e.g., a top surface of the second barrier layer 126).

In an exemplary embodiment, the first barrier layer 122 and the second barrier layer 126 may be each formed of at least one material selected from Ti, Ta, W, Ru, TiN, TaN, and WN. The reflective layer 124 may be formed of at least one material selected from Al, Ng, Ag, Ni, Co, Pt, Cu, and Au.

However, exemplary embodiments of the present inventive concepts are not limited thereto. For example, in another exemplary embodiment, before forming the insulating fence 128, the first barrier layer 122, the reflective layer 124, and the second barrier layer 126 may be formed over the entire area of the second surface 110F2 of the first substrate 110 and then is patterned to form the plurality of discrete lower electrode structures 120. The insulating fence 128 may then be formed to fill a space between the lower electrode structures 120.

Figure 19:
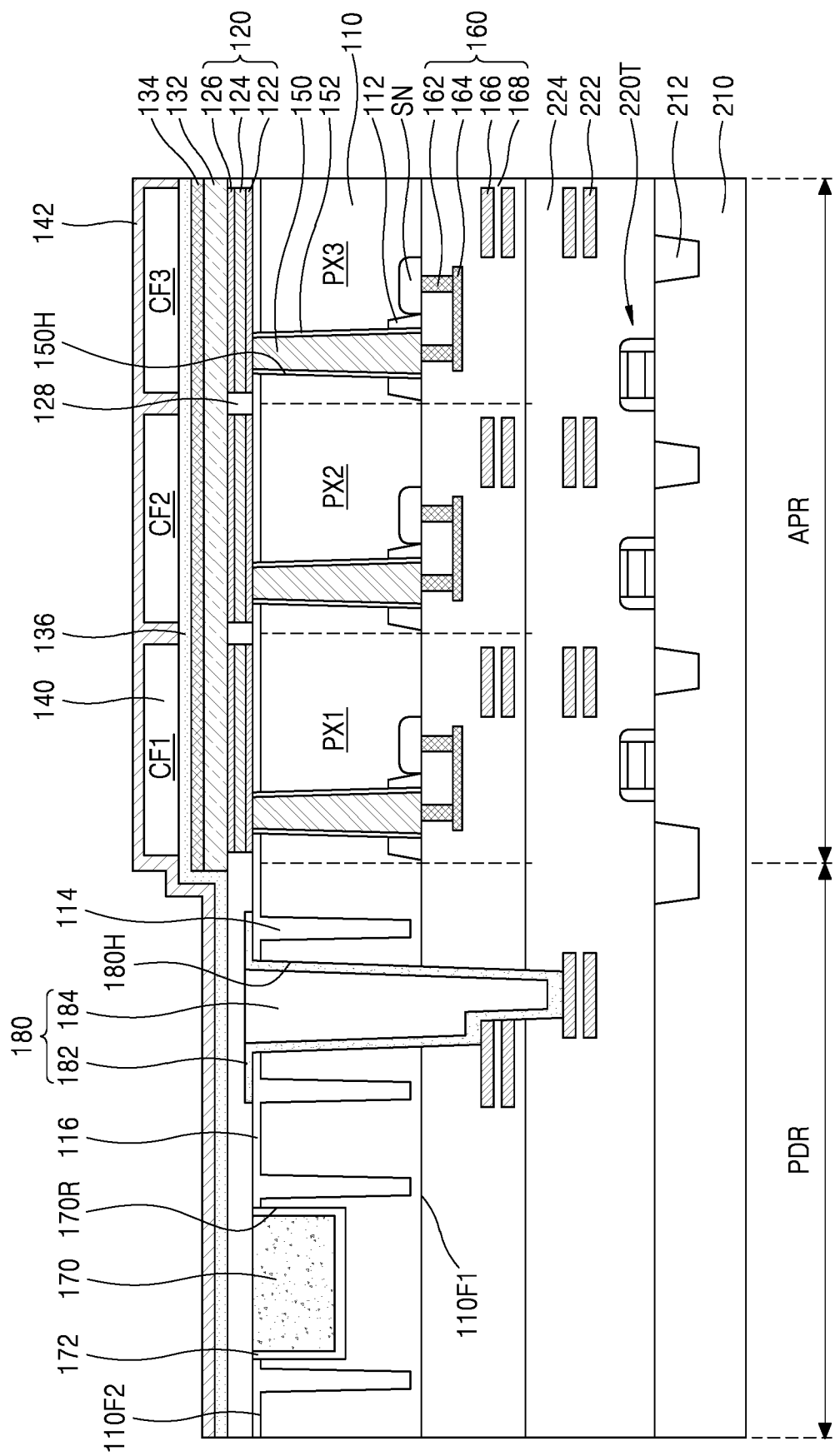

Referring to the exemplary embodiment of FIG. 19, an organic photoelectric conversion layer 132 and an upper electrode 134 may then be sequentially formed on the lower electrode structures 120 and the insulating fence 128. The organic photoelectric conversion layer 132 may be arranged to cover the entirety of the plurality of lower electrode, structures 120.

As shown in the exemplary embodiment of FIG. 19, a first passivation layer 136 may then be formed on the upper electrode 134, and a color filter layer 140 and a second passivation layer 142 may be sequentially formed on the first passivation layer 136.

Referring back to the exemplary embodiment of FIG. 3, a microlens 144 may then be formed on the second passivation layer 142.

A top surface of the pad layer 170 may be exposed again by removing portions of the insulating fence 128, the first passivation layer 136, and the second passivation layer 142 covering the pad layer 170.

The image sensor 100 may be completed according to the above-described process.

While the inventive concept has been particularly shown and described with reference to the exemplary embodiments thereof, it will be understood that various changes in form and details may be made therein without departing, from the spirit and scope of the following claims.

What is claimed is:

1. An image sensor comprising:
    a first substrate having a first surface and a second surface opposite to the first surface, the first substrate including an active pixel region having a plurality of active pixels;
    a plurality of lower electrode structures disposed on the second surface of the first substrate and corresponding to the plurality of active pixels, the plurality of lower electrode structures preventing light from being transmitted to a storage node;
    an upper electrode disposed on the plurality of lower electrode structures;
    an organic photoelectric conversion layer disposed between the plurality of lower electrode structures and the upper electrode; and a second substrate disposed on the first surface of the first substrate, wherein a driving circuit configured to drive the plurality of active pixels is disposed on the second substrate, wherein each of the plurality of lower electrode structures includes:

a first barrier layer;

a reflective layer disposed on the first barrier layer; and a second barrier layer disposed on the reflective layer.

2. The image sensor of claim 1, further comprising:

a color filter layer disposed on the upper electrode; and a microlens disposed on the color kilter layer.

3. The image sensor of claim 2, wherein:

the plurality of active pixels includes a first active pixel configured to sense light in a first wavelength region, a second active pixel configured to sense light in a second wavelength region, and a third active pixel configured to sense light in a third wavelength region, the first wavelength region, the second wavelength region and the third wavelength region are each different from each other; and wherein the color filter layer includes:

a red color filter layer disposed in the first active pixel;

a green color filter layer disposed in the second active pixel; and a blue color filter layer disposed in the third active pixel.

4. The image sensor of claim 3, wherein the red color filter layer, the green color filter layer, and the blue color filter layer are spaced apart from each other and are each disposed at a same level from the first surface of the first substrate.

5. The image sensor of claim 3, wherein:

the first barrier layer has a first thickness in a first direction perpendicular to the first surface of the first substrate; and the reflective layer has a second thickness in the first direction, wherein the second thickness is larger titan the first thickness.

6. The image sensor of claim 5, wherein the second thickness in the first active pixel is larger than the second thickness in the second active pixel.

7. The image sensor of claim 1, further comprising:

a front side structure disposed on the first substrate and positioned between the first surface of the first substrate and the second substrate; and a plurality of micro through-vias penetrating an entire thickness of the first substrate, the plurality of micro through-vias are configured to connect each of the plurality of lower electrode structures to the front side structure.

8. The image sensor of claim 1, wherein the first substrate further includes:

a pad region adjacent to the active pixel region; and a deep trench isolation film extending from the second surface of the first substrate into the first substrate in the pad region, wherein the active pixel region does not include the deep trench isolation film.

9. The image sensor of claim 1, further comprising:

an insulating fence disposed on the second surface of the first substrate and configured to fill spaces between adjacent lower electrode structures of the plurality of lower electrode structures, wherein each of the plurality of lower electrode structures vertically overlaps a corresponding active pixel of the plurality of active pixels.

10. The image sensor of claim 9, wherein a top surface of the insulating fence is disposed at a same level as a top surface of each of the plurality of lower electrode structures.

11. The image sensor of clam 1, wherein:

the first barrier layer and the second barrier layer each include at least one material selected from titanium (Ti), tantalum (Ta), tungsten (W), ruthenium (Ru), titanium nitride (TiN), tantalum nitride (TaN), and tungsten nitride (WN); and the reflective layer includes at least one material selected from aluminum (Al), magnesium (Mg), silver (Ag), nickel (Ni), cobalt (Co), platinum (Pt), copper (Cu), and gold (Au).

12. The image sensor of claim 11, wherein:

the upper electrode is a light-transmitting electrode, wherein the light-transmitting electrode includes at least one compound selected from indium tin oxide (ITO), indium zinc oxide (IZO), zinc oxide (ZnO), tin oxide (SnO), antimony (Sb)-doped tin oxide (ATO), Al-doped tin oxide (AlTO), and fluorine (F)-doped tin oxide (FTO).

13. An image sensor comprising:

a first substrate including an active pixel region having first, second and third active pixels;

first, second and third lower electrode structures are disposed on the first substrate and respectively correspond to the first, second and third active pixels, wherein the first, second and third lower electrode structures prevent light from being transmitted to a storage node;

an upper electrode is disposed on the first, second and third lower electrode structures;

an organic photoelectric conversion layer is disposed between the first lower electrode structure and the upper electrode, between the second lower electrode structure and the upper electrode, and between the third lower electrode structure and the upper electrode; and first, second and third color filter layers are disposed on the upper electrode and respectively correspond to the first, second and third active pixels, wherein at least one of the first, second and third lower electrode structures includes:

a first barrier layer;

a reflective layer disposed on the first barrier layer; and a second barrier layer disposed on the reflective layer.

14. The image sensor of claim 13, wherein:

the first active pixel is configured to sense light in a first wavelength region, and the first color filter layer includes a red color filter layer;

the second active pixel is configured to sense light in a second wavelength region different from the first wavelength region, and the second color filter layer includes a green color filter layer; and the third active pixel is configured to sense light in a third wavelength region different from the first and second wavelength regions, and the third color filter layer includes a blue color filter layer.

15. The image sensor of claim 13, further comprising an insulating fence disposed on the first substrate and configured to fill spaces between the first, second and third lower electrode structures, wherein a top surface of the insulating fence directly contacts a bottom surface of the organic photoelectric conversion layer.

16. The image sensor of claim 13, wherein the first substrate includes a first surface and a second surface, wherein the first, second and third lower electrode structures are disposed on the second surface; and the image sensor further comprises:

a front side structure disposed on the first surface of the first substrate; and a second substrate disposed on the front side structure, wherein a driving circuit configured to drive the first, second and third active pixels is disposed on the second substrate.

17. The image sensor of claim 16, further comprising:

a plurality of micro through-vias penetrating the first substrate and configured to connect each of the first, second and third lower electrode structures to the front side structure, wherein the plurality of micro through-vias includes a metal material; and an interconnect via structure arranged in an interconnect via bole that penetrates the first substrate and extends into the second substrate, the interconnect via structure is configured to electrically connect to the front side structure.

18. An image sensor comprising:

a first substrate having a first surface and a second surface opposite to the first surface, the first substrate including an active pixel region having a plurality of active pixels;

a plurality of lower electrode structures disposed on the second surface of the first substrate and corresponding to the plurality of active pixels, each of the plurality of lower electrode structures including a first barrier laver, a reflective layer, and a second barrier layer, wherein the plurality of lower electrode structures prevent light from being transmitted to a storage node;

an upper electrode disposed on the plurality of lower electrode structures;

an organic photoelectric conversion layer disposed between the plurality of lower electrode structures and the upper electrode;

a color filter layer disposed on the upper electrode and corresponding to the plurality of active pixels; and a second substrate disposed on the first surface of the first substrate, a driving circuit configured to drive the plurality of active pixels is disposed on the second substrate, wherein the first substrate does not include a photodiode.

19. The image sensor of claim 18, wherein:

the plurality of active pixels includes first, second and third active pixels; and the color filter layer includes:

a red color filter layer disposed in the first active pixel;

a green color filter layer disposed in the second active pixel; and a blue color filter layer disposed in the third active.

20. The image sensor of claim 18, further comprising:

an insulating fence disposed on the first surface of the first substrate, the insulating fence configured to fill spaces between the plurality of electrode structures, wherein each of the plurality of lower electrode structures vertically overlaps a corresponding active pixel of the plurality of active pixels, and the first substrate does not include a deep trench isolation film that penetrates the first substrate.

* * * * *